United States Patent
Yamazaki et al.

(10) Patent No.: US 8,338,827 B2
(45) Date of Patent: Dec. 25, 2012

(54) SEMICONDUCTOR DEVICE AND METHOD FOR MANUFACTURING THE SAME

(75) Inventors: Shunpei Yamazaki, Tokyo (JP); Junichiro Sakata, Kanagawa (JP); Tetsunori Maruyama, Kanagawa (JP); Yuki Imoto, Kanagawa (JP); Yuji Asano, Kanagawa (JP); Junichi Koezuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 499 days.

(21) Appl. No.: 12/612,021

(22) Filed: Nov. 4, 2009

(65) Prior Publication Data

US 2010/0117073 A1      May 13, 2010

(30) Foreign Application Priority Data

Nov. 7, 2008 (JP) ................. 2008-287051

(51) Int. Cl.
*H01L 29/10* (2006.01)
(52) U.S. Cl. .................. 257/43; 257/E29.296
(58) Field of Classification Search .......... 257/43, 257/E29.296; 438/104, 159
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |

(Continued)

FOREIGN PATENT DOCUMENTS

EP    1737044 A    12/2006

(Continued)

OTHER PUBLICATIONS

"Search Report (Application No. 09174041.5) Dated Mar. 25, 2010".

(Continued)

*Primary Examiner* — Mark Prenty
(74) *Attorney, Agent, or Firm* — Eric J. Robinson; Robinson Intellectual Property Law Office, P.C.

(57) ABSTRACT

In a thin film transistor which uses an oxide semiconductor, buffer layers containing indium, gallium, zinc, oxygen, and nitrogen are provided between the oxide semiconductor layer and the source and drain electrode layers.

12 Claims, 26 Drawing Sheets

U.S. PATENT DOCUMENTS

| | | |
|---|---|---|
| 7,804,091 B2 | 9/2010 | Takechi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0008645 A1 | 1/2009 | Yamazaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0239335 A1 | 9/2009 | Akimoto et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025679 A1 | 2/2010 | Yamazaki et al. |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109058 A1 | 5/2010 | Sakata et al. |
| 2010/0163868 A1* | 7/2010 | Yamazaki et al. ............ 257/43 |
| 2010/0320471 A1 | 12/2010 | Takechi et al. |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-040343 A | 2/2008 |
| JP | 2008-042088 A | 2/2008 |
| WO | WO-2004/114391 | 12/2004 |

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3-ZnGa_2O_4-ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties.", J. Appl. Phys. (Journal of Applied Physics), Feb. 1, 2003, vol. 93, No. 3, pp. 1624-1630.

Asakuma.N et al., "Crystallization and Reduction of SOL-Gel-Derived Zinc Oxide Films by Irradiation With Ultraviolet Lamp,", Journal of SOL-Gel Science and Technology, 2003, vol. 26, pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3$(M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo ($Ga_2O_3-In_2O_3-ZnO$) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2: AL and SN-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4: Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2: Distinguished Paper: World-Largest (6.5') Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3: Invited Paper: Transparent Amorphous Oxide Semiconductors for High Performance TFT,", SID Digest '07: SID International Symposium Digest of Technical Papers, 2007, vol. 38, pp. 1830-1833.

Godo.H et al., "P-9: Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1: Invited Paper: Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2: Invited Paper: Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29: Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO$_3$(ZnO)m (m<4): a Zn 4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), January 26, 2007, vol. 98, pp. 045501-1-045501-4.

Park.J at al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

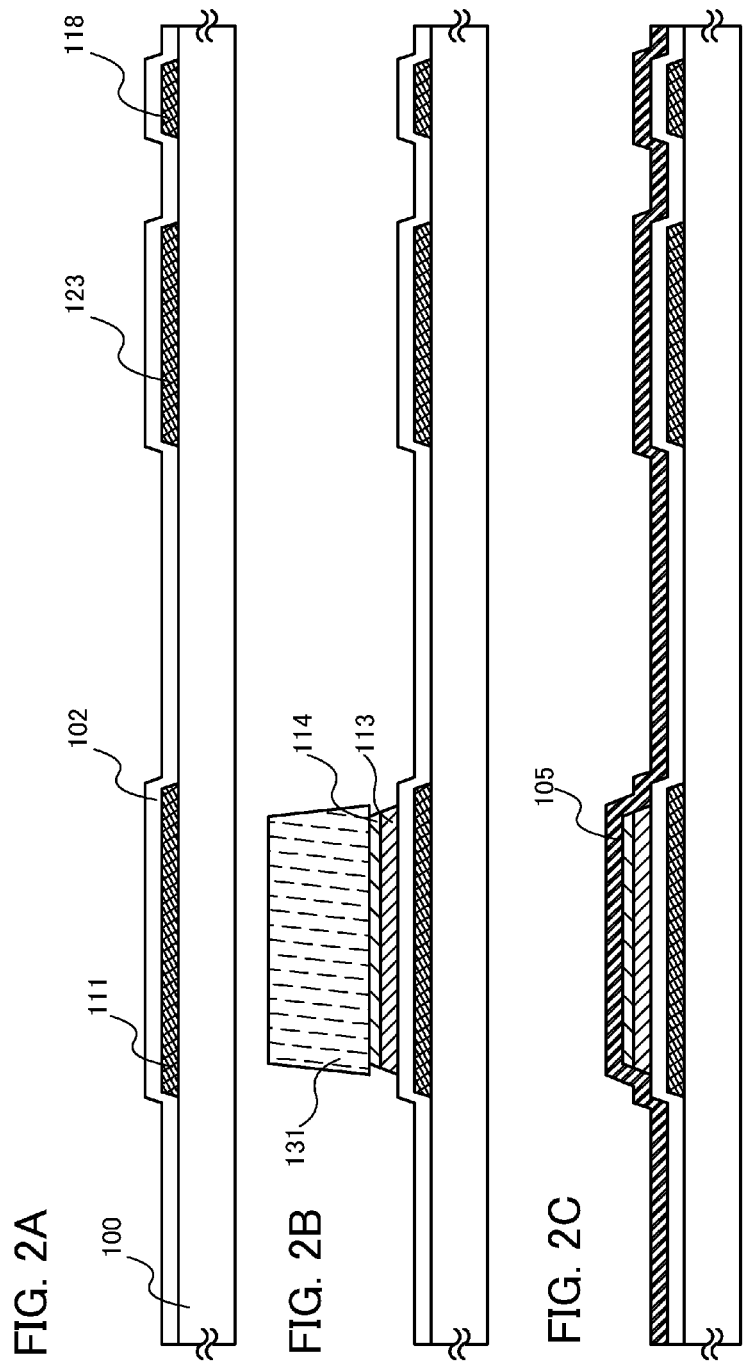

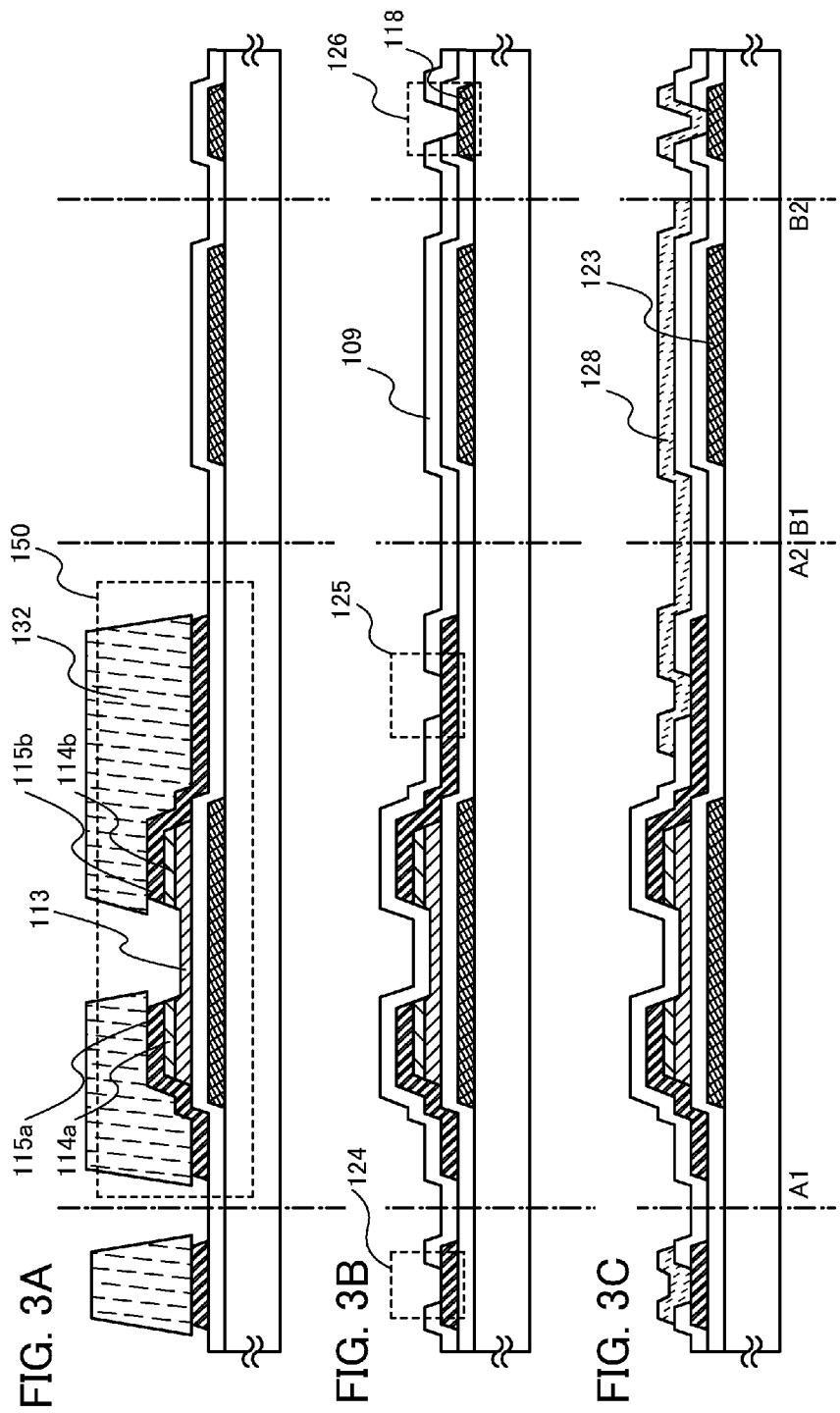

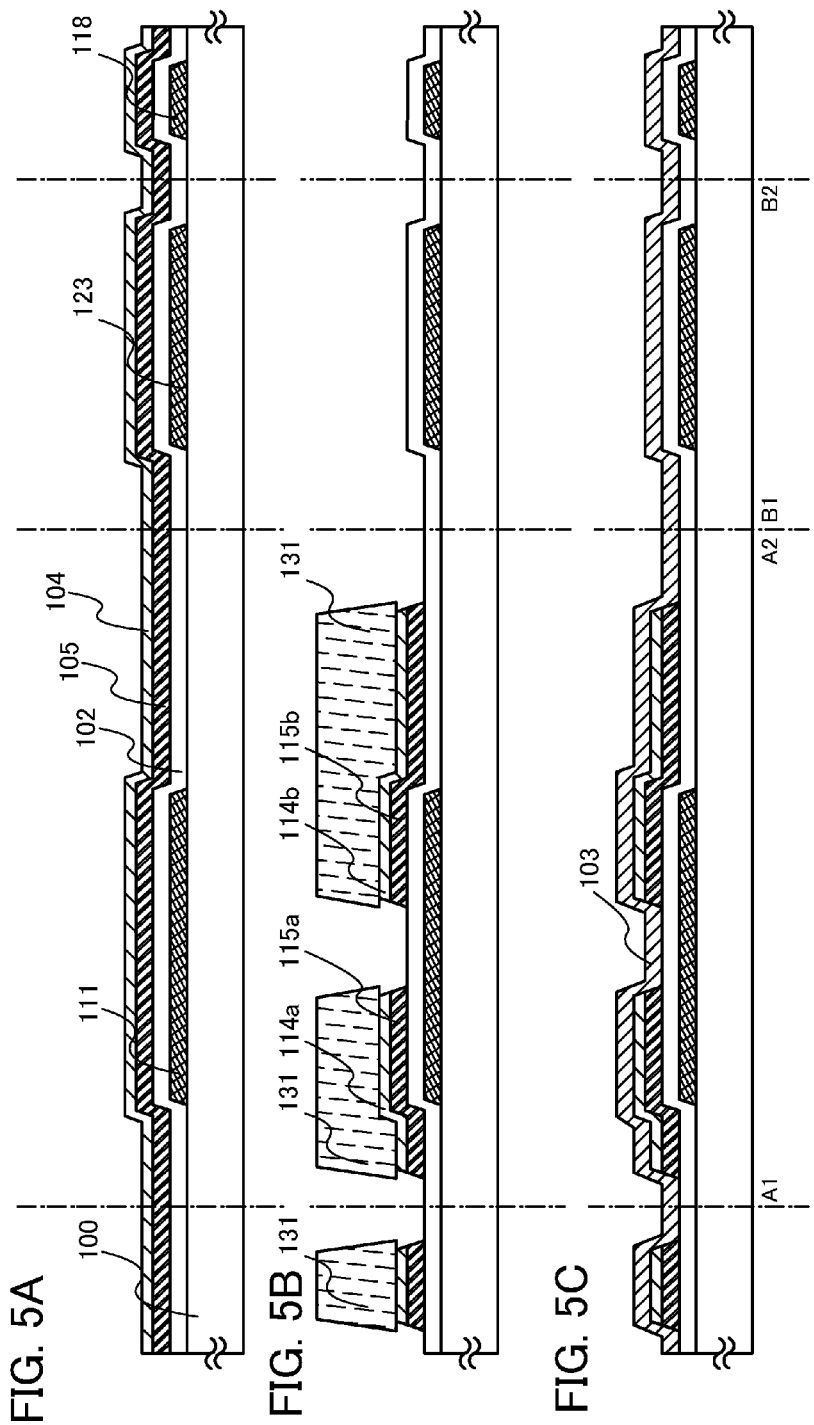

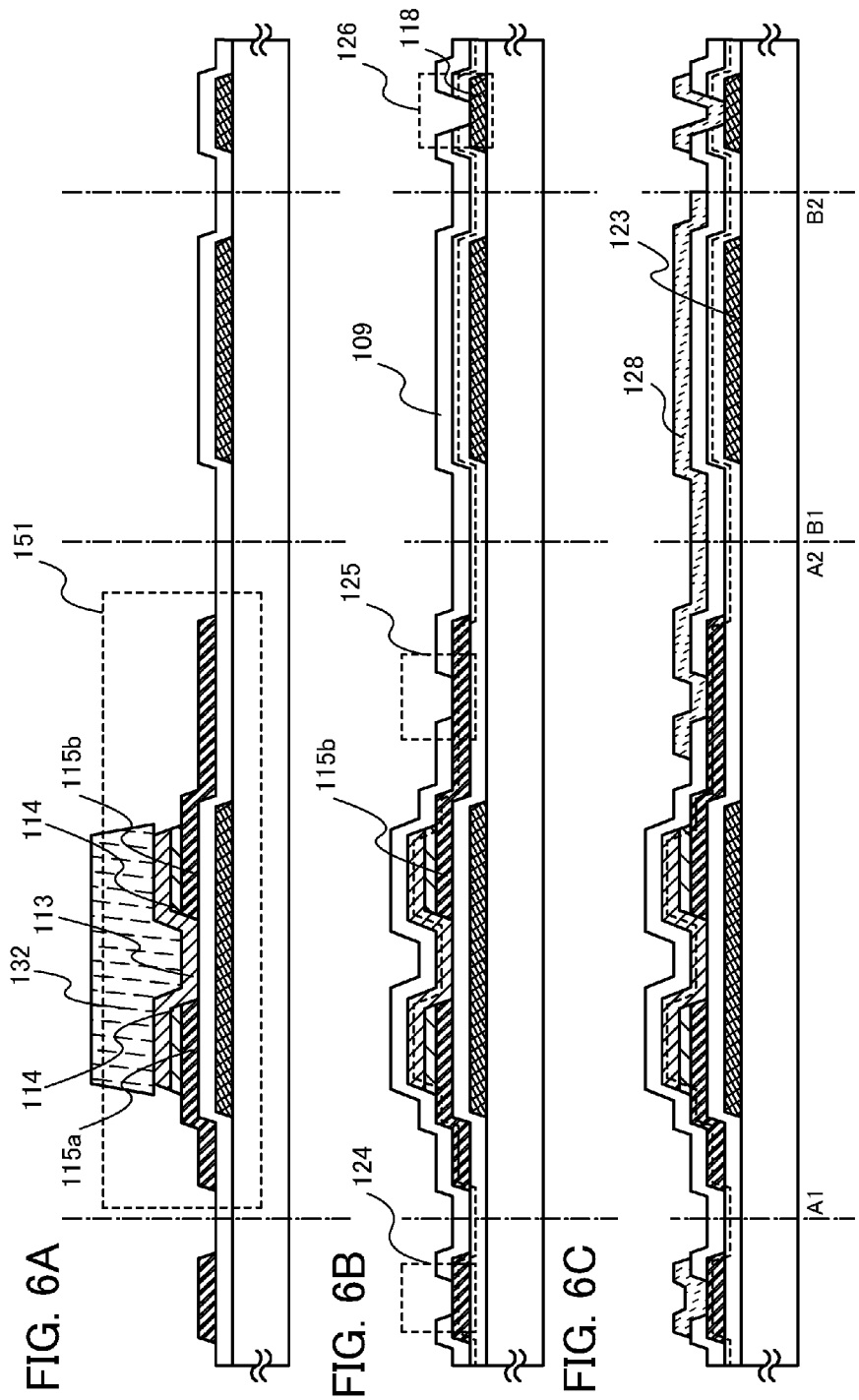

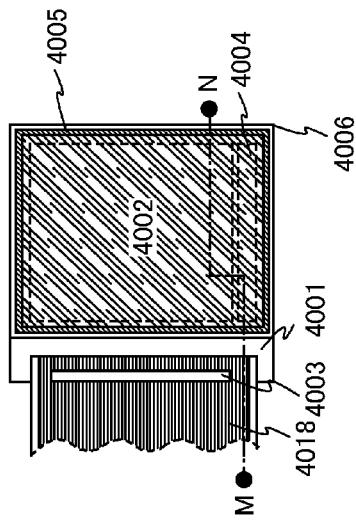
FIG. 14A1
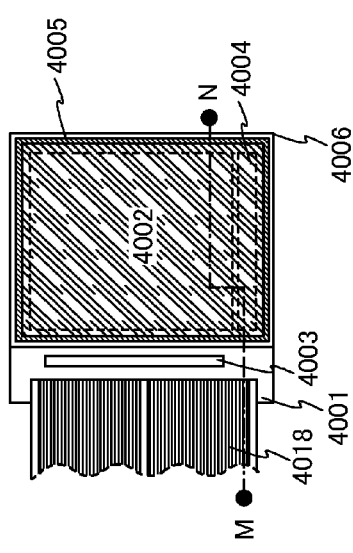
FIG. 14A2
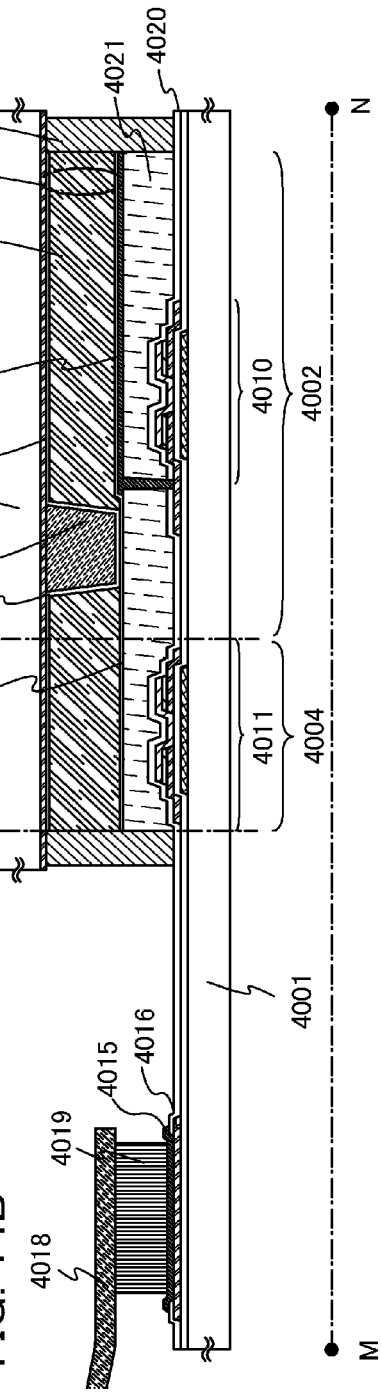
FIG. 14B

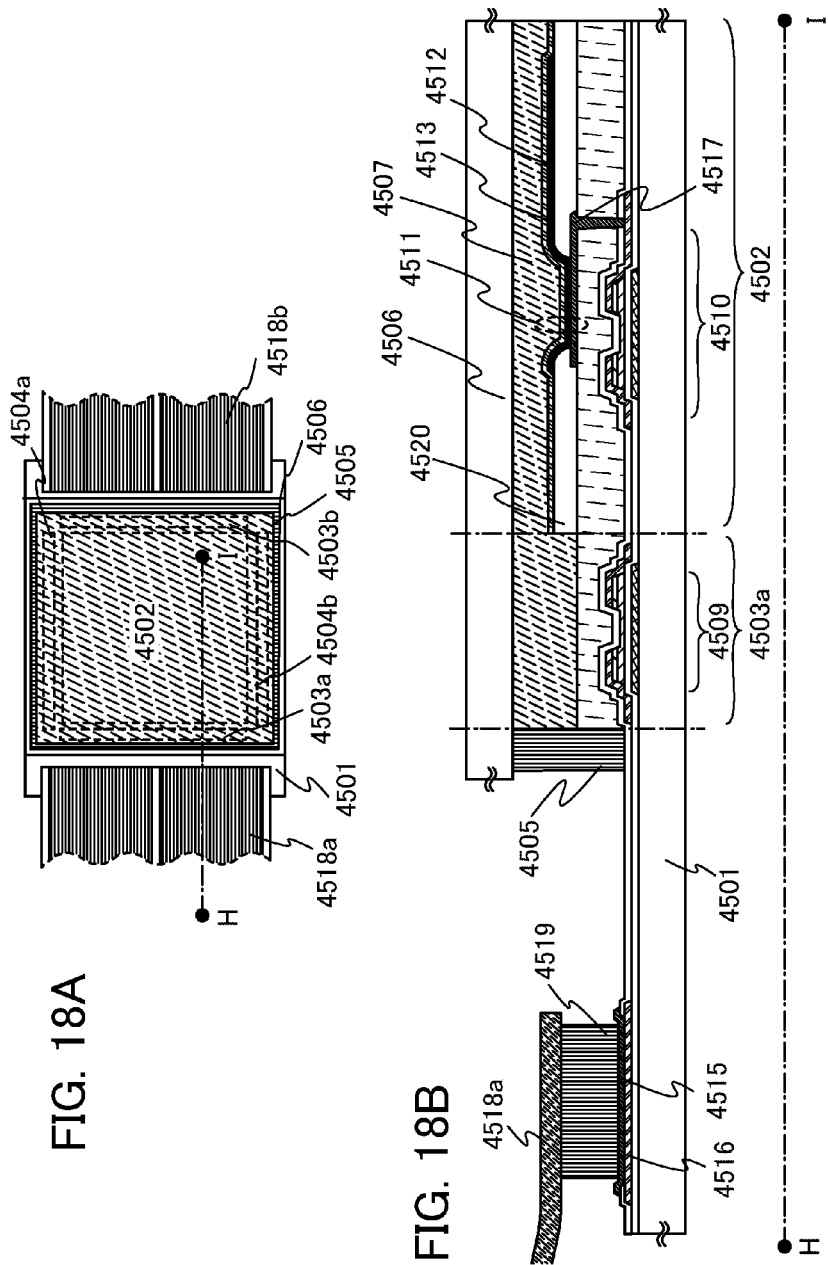

FIG. 26A
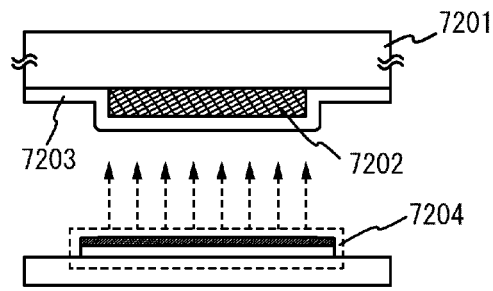
FIG. 26B
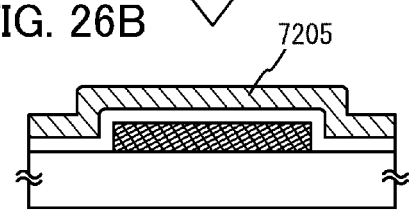
FIG. 26G
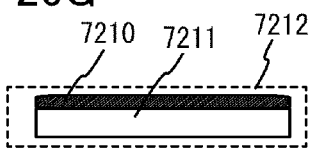
FIG. 26C
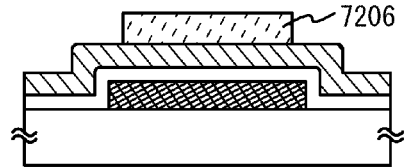
FIG. 26F
FIG. 26D
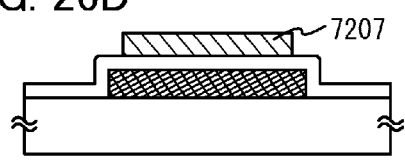
FIG. 26E
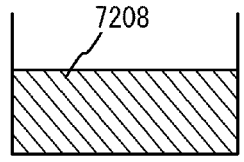

SEMICONDUCTOR DEVICE AND METHOD FOR MANUFACTURING THE SAME

BACKGROUND OF THE INVENTION

1. Field of the Invention

The present invention relates to a semiconductor device in which an oxide semiconductor film is used for a channel formation region, and a method for manufacturing the semiconductor device. For example, the present invention relates to thin film transistors, or electronic devices which are mounted with, as a component, electro-optical devices typified by liquid crystal display panels including a thin film transistor or electronic devices which have light-emitting display devices including an organic light-emitting element.

In this specification, a "semiconductor device" refers to a device which can function by utilizing semiconductor characteristics; an electro-optical device, and an electronic device using a semiconductor circuit and a semiconductor element are all included in semiconductor devices.

2. Description of the Related Art

In recent years, active matrix display devices (such as liquid crystal display devices, light-emitting display devices, or electrophoretic display devices) in which a switching element including a thin film transistor (hereinafter, referred to as a TFT) is provided in each of display pixels arranged in a matrix have been actively developed. In the active matrix display devices, a switching element is provided in each of pixels (or each of dots), and thus, there is such an advantage that the active matrix display devices can be driven at lower voltage than passive matrix display devices in the case where the number of pixels is increased.

In addition, a technique has attracted attention, where a thin film transistor (TFT) or the like in which an oxide semiconductor is used for a channel formation region is manufactured and such a TFT or the like is applied to electronic devices or optical devices. For example, a thin film transistor in which ZnO is used for a channel formation region or a thin film transistor in which an oxide containing indium, gallium, and zinc is used for a channel formation region can be used as such a TFT. Further, Patent Documents 1 and 2 and the like disclose a technique where such a thin film transistor in which an oxide semiconductor is used for a channel formation region is formed over a light-transmitting substrate and used for a switching element or the like of an image display device.

REFERENCES

[Patent Document]
Patent Document 1: Japanese Published Patent Application No. 2007-123861
Patent Document 2: Japanese Published Patent Application No. 2007-096055

SUMMARY OF THE INVENTION

For a thin film transistor in which an oxide semiconductor is used for a channel formation region, high speed operation, a comparatively easy manufacturing process, and sufficient reliability are required.

In formation of a thin film transistor, a low resistance metal material is used for a conductive layer including a source and drain electrodes. In particular, when a display device with a large-area display is manufactured, a problem of signal delay due to the resistance of a wiring significantly arises. Accordingly, it is preferable that a metal material with a low electric resistance be used as a material of a wiring and an electrode.

However, in a thin film transistor having a structure in which an oxide semiconductor layer is in direct contact with a source and drain electrodes formed using a metal material, there is a concern that contact resistance increases. One of the conceivable reasons for increase of contact resistance is Schottky junction formed in a contact surface between the source and drain electrodes and the oxide semiconductor layer.

It is an object of an embodiment of the present invention to provide a semiconductor device in which the contact resistance between an oxide semiconductor layer used for a channel formation region and a source and drain electrodes is reduced, and to provide a method for manufacturing the semiconductor device.

Further, it is another object of an embodiment of the present invention to reduce variation in electric properties of a semiconductor device using an oxide semiconductor. For example, in a liquid crystal display device or a display device using an organic light-emitting element, there is a concern that display unevenness is caused due to variation in the transistor characteristics of the semiconductor device. In particular, in a display device including a light-emitting element, in the case where there is a large variation in ON current ($I_{on}$) of TFTs (TFTs supplying current to a driver circuit or light-emitting elements arranged in pixels) arranged so as to supply a constant current to a pixel electrode, there is a concern that variation in the emission luminance of the light-emitting elements provided in the pixels is caused. An embodiment of the present invention aims to achieve at least one of the above-described objects.

An example of an oxide semiconductor used in this specification is represented by $InMO_3(ZnO)_m$ (m>0). A thin film transistor in which a thin film formed using the oxide semiconductor is used for a channel formation region is manufactured. Note that M denotes one or more metal elements selected from Ga, Fe, Ni, Mn, and Co. In addition to a case where only Ga is contained as M, there is a case where Ga and any of the above metal elements other than Ga, for example, Ga and Ni or Ga and Fe are contained as M. Further, in some cases, the above oxide semiconductor contains a transition metal element such as Fe or Ni or an oxide of the transition metal as an impurity element in addition to the metal element which is contained as M. In this specification, this thin film is also referred to as an oxide semiconductor film containing indium, gallium, and zinc or an In—Ga—Zn—O-based non-single-crystal film. Note that a concentration of sodium (Na) included in an In—Ga—Zn—O-based non-single-crystal film is less than or equal to $5\times10^{18}/cm^3$, preferably less than or equal to $1\times10^{18}/cm^3$.

Further, a target including, as its component, an oxide containing indium, gallium, and zinc is sputtered in an atmosphere including a nitrogen gas to deposit an oxynitride film containing indium, gallium, and zinc, and heat treatment is performed on the oxynitride film, whereby a favorable conductive film can be obtained.

Then, an oxide semiconductor layer containing indium, gallium, and zinc is used for a channel formation region, and buffer layers including an oxynitride containing indium, gallium, and zinc are interposed between the oxide semiconductor layer and a source and drain electrodes, whereby the contact resistance of a thin film transistor can be reduced.

Note that in the oxynitride film containing indium, gallium, and zinc, which is deposited in such a manner that a target including, as its component, an oxide containing indium, gallium, and zinc is sputtered in an atmosphere including a nitrogen gas, the higher the concentration of the nitrogen gas in the deposition atmosphere is, the higher the proportion of nitrogen in the composition of the oxynitride film is and the lower the proportion of oxygen is. Thus, it can be said that an oxygen atom is mainly substituted with a nitrogen atom and conductivity is developed by substitution of an oxygen atom with a nitrogen atom having a valence different from that of an oxygen atom.

An embodiment of the present invention is a semiconductor device including: an oxide semiconductor layer containing indium, gallium, and zinc; and a thin film transistor where buffer layers including indium, gallium, zinc, oxygen, and nitrogen are provided between the oxide semiconductor layer and a source and drain electrodes, and a method for manufacturing the thin film transistor.

A thin film transistor according to an embodiment of the present invention includes a gate electrode, a gate insulating film which covers the gate electrode, an oxide semiconductor layer which overlaps with the gate electrode with the gate insulating film interposed therebetween, and a first electrode and a second electrode over the oxide semiconductor layer, whose end portions overlap with the gate electrode. The thin film transistor includes a first buffer layer which is in contact with and interposed between the oxide semiconductor layer and the first electrode, and a second buffer layer which is in contact with and interposed between the oxide semiconductor layer and the second electrode. The first buffer layer and the second buffer layer include indium, gallium, zinc, oxygen, and nitrogen.

Further, a thin film transistor according to an embodiment of the present invention includes a gate insulating film which covers a gate electrode, a first electrode and a second electrode whose end portions overlap with the gate electrode with the gate insulating film interposed therebetween, a first buffer layer over the first electrode, a second buffer layer over the second electrode, and an oxide semiconductor layer which overlaps with end portions of the first electrode and the second electrode. Furthermore, the oxide semiconductor layer is in contact with side surfaces of the first electrode and the second electrode and top surfaces and side surfaces of the first buffer layer and the second buffer layer, and the first buffer layer and the second buffer layer contain indium, gallium, zinc, oxygen, and nitrogen.

Further, in the above thin film transistor according to an embodiment of the present invention, the proportion (N/O) of nitrogen (N) to oxygen (O) included in the buffer layers is greater than or equal to 5 at. % and less than or equal to 80 at. %.

Further, in the above thin film transistor according to an embodiment of the present invention, the oxide semiconductor layer contains indium, gallium, and zinc.

Further, an embodiment of the present invention is a method for manufacturing a semiconductor device including the steps of: forming a gate electrode over a substrate; forming a gate insulating film over the gate electrode; forming an oxide semiconductor layer over the gate insulating film, which contains indium, gallium, and zinc and overlaps with the gate electrode; forming buffer layers over the oxide semiconductor layer; and forming a first electrode and a second electrode over the buffer layers. Note that the buffer layers are formed in such a manner that a target which includes, as its component, an oxide containing indium, gallium, and zinc is sputtered in an atmosphere including a nitrogen gas.

In addition, an embodiment of the present invention is a method for manufacturing a semiconductor device including the steps of: forming a gate electrode over a substrate; forming a gate insulating film over the gate electrode; forming a first electrode and a second electrode over the gate insulating film, whose end portions overlap with the gate electrode; forming buffer layers over the first electrode and the second electrode; and forming an oxide semiconductor layer containing indium, gallium, and zinc over the buffer layers. Note that the buffer layers are formed in such a manner that a target including, as its component, an oxide containing indium, gallium, and zinc is sputtered in an atmosphere including a nitrogen gas.

According to an embodiment of the present invention, a thin film transistor with small parasitic capacitance and a high on/off ratio can be obtained. Accordingly, a semiconductor device with high electric characteristics and high reliability can be provided.

BRIEF DESCRIPTION OF THE DRAWINGS

In the accompanying drawings:

FIGS. 2A to 2C are cross-sectional views illustrating a manufacturing process of a semiconductor device of an embodiment of the present invention;

FIGS. 3A to 3C are cross-sectional views illustrating a manufacturing process of a semiconductor device of an embodiment of the present invention;

FIGS. 5A to 5C are cross-sectional views illustrating a manufacturing process of a semiconductor device of an embodiment of the present invention;

FIGS. 6A to 6C are cross-sectional views illustrating a manufacturing process of a semiconductor device of an embodiment of the present invention;

FIGS. 14A1 and 14A2 are top views and FIG. 14B is a cross-sectional view illustrating a semiconductor device of an embodiment of the present invention;

FIG. 18A and FIG. 18B are a top view and a cross-sectional view, respectively, illustrating a semiconductor device of an embodiment of the present invention;

FIG. 26A to FIG. 26G are views each illustrating a step for reusing an oxide semiconductor included in etching waste liquid.

DETAILED DESCRIPTION OF THE INVENTION

Figure 1A:
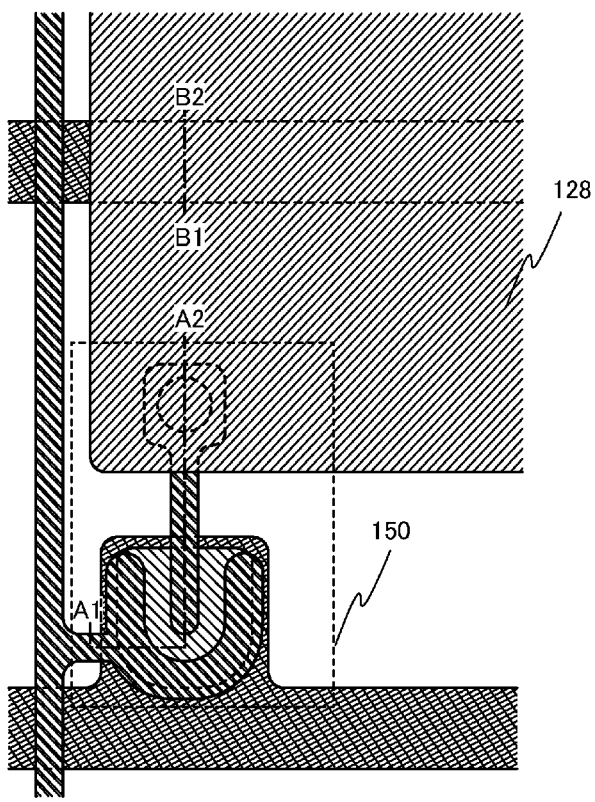
FIGS. 1A and 1B are a top view and a cross-sectional view, respectively, illustrating a semiconductor device of an embodiment of the present invention.

Hereinafter, embodiments of the present invention will be described in detail with reference to the accompanying drawings. Note that the present invention is not limited to the following description. It is easily understood by those skilled in the art that various changes may be made in forms and details without departing from the spirit and the scope of the present invention. Therefore, the present invention is not construed as being limited to description of the embodiment modes. Note that in the structures of the present invention described below, like portions or portions having a similar function are denoted by like reference numerals, and the description thereof is omitted.

Embodiment 1

In this embodiment, a thin film transistor of a semiconductor device and a manufacturing process thereof will be described. Specifically, a manufacturing process of a pixel portion of a display device including a thin film transistor will be described.

Figure 1B:
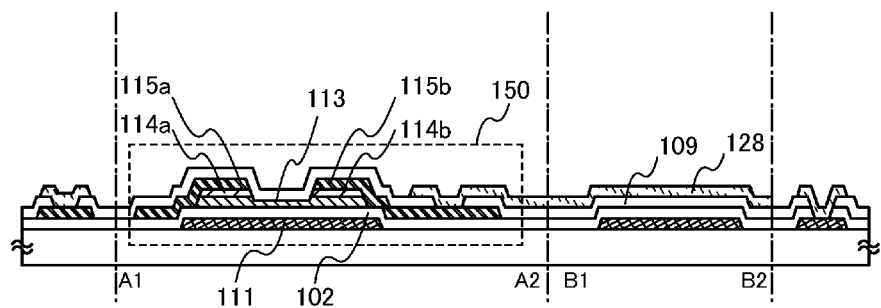

FIGS. 1A and 1B illustrate a thin film transistor of this embodiment. FIG. 1A is a top view and FIG. 1B is a cross-sectional view taken along line A1-A2 and line B1-B2 of FIG. 1A.

An oxide semiconductor layer 113 of a thin film transistor 150 illustrated in FIGS. 1A and 1B is provided under a first electrode 115a and a second electrode 115b which face with each other, thereby covering a gate electrode 111 with a gate insulating film interposed therebetween. That is, the oxide semiconductor layer 113 is provided so as to overlap with the gate electrode 111 and be in contact with a top surface of the gate insulating film 102 and bottom surfaces of buffer layers (114a and 114b). Here, the buffer layer 114a is provided between the first electrode 115a and the oxide semiconductor layer 113, and similarly, the buffer layer 114b is provided between the second electrode 115b and the oxide semiconductor layer 113.

The oxide semiconductor layer is formed using an In—Ga—Zn—O-based non-single-crystal film. A composition ratio of the In—Ga—Zn—O-based non-single-crystal film depends on deposition conditions. Deposition is performed by a sputtering method using a target in which a composition ratio of a metal oxide is $In_2O_3:Ga_2O_3:ZnO=1:1:1$ (a composition ratio of a metal element is $In:Ga:Zn=1:1:0.5$). Here, Condition 1 is a deposition condition in which the flow rate of an argon gas is 40 sccm and Condition 2 is a deposition condition in which the flow rate of an argon gas is 10 sccm and the flow rate of oxygen is 5 sccm.

The composition ratios of the oxide semiconductor films which are deposited under different conditions are measured by inductively coupled plasma mass spectrometry (ICP-MS). The typical composition ratio of the oxide semiconductor film which is deposited under Condition 1 is $InGa_{0.95}Zn_{0.41}O_{3.33}$ and the typical composition ratio of the oxide semiconductor film which is deposited under Condition 2 is $InGa_{0.94}Zn_{0.40}O_{3.31}$.

When quantification is performed using Rutherford backscattering spectrometry (RBS) instead of ICP-MS, the typical composition ratio of the oxide semiconductor film which is deposited under Condition 1 is $InGa_{0.93}Zn_{0.44}O_{3.49}$ and the typical composition ratio of the oxide semiconductor film which is deposited under Condition 2 is $InGa_{0.92}Zn_{0.45}O_{3.86}$.

Note that the oxide semiconductor film which is deposited by a sputtering method is subjected to heat treatment at 200° C. to 500° C., typically, 300° C. to 400° C. for 10 minutes to 100 minutes. In analysis by an X-ray diffraction (XRD) method, the oxide semiconductor film is a non-single-crystal film in which an amorphous structure is observed.

The buffer layer 114a is provided between the oxide semiconductor layer 113 and the first electrode 115a so as to be in contact with them and the buffer layer 114b is provided between the oxide semiconductor layer 113 and the second electrode 115b so as to be in contact with them. Further, the buffer layers (114a and 114b) are formed using oxynitride containing indium, gallium, and zinc and have a higher electric conductivity than the oxide semiconductor layer 113. Therefore, in the thin film transistor 150 of this embodiment, the buffer layers (114a and 114b) can have functions similar to those of a source region and a drain region of a transistor.

In this manner, the buffer layers (114a and 114b) having a higher electric conductivity than the oxide semiconductor layer are provided between the oxide semiconductor layer 113 and the first electrode 115a and between the oxide semiconductor layer 113 and the second electrode 115b, whereby the thin film transistor 150 can be operated stably. Moreover, the amount of junction leakage can be reduced and the characteristics of the thin film transistor 150 can be improved.

Next, a method for manufacturing the thin film transistor 150 of FIGS. 1A and 1B will be described with reference to FIGS. 2A to 2C and FIGS. 3A to 3C.

In FIG. 2A, as a substrate 100, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. For example, a glass substrate which includes more barium oxide (BaO) than boric acid ($B_2O_3$) in composition ratio and whose strain point is higher than or equal to 730° C. is preferable. This is because the glass substrate is not strained even when heat treatment is performed on the oxide semiconductor layer at a high temperature of about 700° C.

Alternatively, a metal substrate such as a stainless steel alloy substrate which is provided with an insulating film over the surface may also be used. When the substrate 100 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

Further, as a base film, an insulating film may be formed over the substrate 100. The base film may be formed with a single layer or a stacked layer of a silicon oxide film, a silicon nitride film, a silicon oxynitride film, and/or a silicon nitride oxide film by a CVD method, a sputtering method, or the like.

Next, a conductive film which is to be a gate wiring including the gate electrode 111, a capacitor wiring, and a terminal portion is deposited. The conductive film can be deposited using titanium (Ti), tantalum (Ta), tungsten (W), molybdenum (Mo), chromium (Cr), platinum (Pt), copper (Cu), gold (Au), silver (Ag), or the like. Above all, the conductive film is preferably formed using a low-resistant conductive material such as aluminum (Al) or copper (Cu); however, since aluminum alone has problems such as low heat resistance and a tendency to be corroded, it is used in combination with a heat-resistant conductive material to form the conductive film.

As the conductive film, a film including, as a main component, aluminum to which an element such as titanium (Ti), tantalum (Ta), tungsten (W), molybdenum (Mo), chromium (Cr), neodymium (Nd), scandium (Sc), nickel (Ni), platinum (Pt), copper (Cu), gold (Au), silver (Ag), manganese (Mn), carbon (C), or silicon (Si) is added; an alloy material containing any of these elements as a main component, or an aluminum alloy to which a compound is added as a main component is preferably used.

Further, the conductive film can have a layered structure in which a conductive film formed using a heat-resistant conductive material is stacked over a low-resistant conductive film. As the heat-resistant conductive material, an element selected from titanium (Ti), tantalum (Ta), tungsten (W), molybdenum (Mo), chromium (Cr), neodymium (Nd), or scandium (Sc); an alloy containing any of these elements; an alloy film including a combination of these elements; or a nitride containing any of these elements is used.

Further, a transparent conductive film may be used, and as the material, indium oxide-tin oxide alloy ($In_2O_3$—$SnO_2$, abbreviated as ITO), indium tin oxide containing silicon or silicon oxide, indium zinc oxide, zinc oxide, or the like can be used.

The conductive film which is to be the gate electrode 111 is formed to a thickness of greater than or equal to 50 nm and less than or equal to 300 nm by a sputtering method or a vacuum evaporation method. When the conductive film which is to be the gate electrode 111 is formed to a thickness of less than or equal to 300 nm, a disconnection of a semiconductor film and a wiring which are to be formed later can be prevented. Further, when the conductive film which is to be the gate electrode 111 is formed to a thickness of greater than or equal to 50 nm, reduction in resistance of the gate electrode 111 and increase in area become possible.

Note that in this embodiment, as the conductive film, a film including aluminum as its main component and a titanium film are deposited to be stacked over an entire surface of the substrate 100 by a sputtering method.

Next, with use of a resist mask formed using a first photomask in this embodiment, an unnecessary portion of the conductive film formed over the substrate 100 is removed by etching to form wirings and an electrode (a gate wiring including the gate electrode 111, a capacitor wiring, and a terminal). At this time, etching is performed so that at least an end portion of the gate electrode 111 is tapered.

Next, the gate insulating film 102 is formed. As an insulating film which can be used as the gate insulating film 102, a silicon oxide film, a silicon nitride film, a silicon oxynitride film, a silicon nitride oxide film, an aluminum oxide film, an aluminum nitride film, a magnesium oxide film, an yttrium oxide film, a hafnium oxide film, or a tantalum oxide film can be given.

Here, a silicon oxynitride film means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

The gate insulating film 102 may have a single-layer structure or a layered structure in which two or three insulating films are stacked. For example, when the gate insulating film 102 in contact with the substrate is formed using a silicon nitride film or a silicon nitride oxide film, adhesion between the substrate 100 and the gate insulating film 102 is increased, impurities from the substrate 100 can be prevented from diffusing into the oxide semiconductor layer 113, and oxidation of the conductive layer including the gate electrode 111 can be prevented. That is, film peeling can be prevented, and electric characteristics of a thin film transistor to be completed later can be improved.

The thickness of the gate insulating film 102 is 50 nm to 250 nm. The gate insulating film 102 with a thickness of greater than or equal to 50 nm can cover projections and depressions of the conductive layer including the gate electrode 111, which is preferable.

In this embodiment, a 100-nm-thick silicon oxide film is deposited as the gate insulating film 102 by a plasma CVD method or a sputtering method. FIG. 2A is a cross-sectional view at this stage.

Next, plasma treatment may be performed on the gate insulating film 102 prior to formation of the oxide semiconductor film. In this embodiment, an oxygen gas and an argon gas are introduced into a sputtering apparatus where the substrate has been carried in and plasma is generated so that an exposed surface of the gate insulating film 102 is subjected to reverse sputtering to be irradiated with oxygen radicals, oxygen or the like. Thus, dust adhering to the surface is removed.

The oxide semiconductor film is deposited on the gate insulating film 102 on which plasma treatment has been performed without exposure of the gate insulating film 102 to air. Deposition of the oxide semiconductor film without exposure of the gate insulating film 102 on which plasma treatment has been performed to air is effective in that dust or moisture is not adhered to the interface between the gate insulating film 102 and the oxide semiconductor film. Note that the oxide semiconductor film may be deposited in the same chamber as that in which the reverse sputtering has been performed, or may be deposited in a chamber different from that in which the reverse sputtering has been performed as long as it can be deposited without exposure to air.

In this embodiment, the oxide semiconductor film is deposited using an oxide semiconductor target including In, Ga, and Zn and having a diameter of 8 inches (composition ratio is $In_2O_3$:$Ga_2O_3$:$ZnO$=1:1:1). As the deposition method, a sputtering method is used and deposition is performed under an argon atmosphere or an oxygen atmosphere under the following conditions: the distance between the substrate and the target is 170 mm, the pressure is 0.4 Pa, the direct-current (DC) power source is 0.5 kW. Note that it is preferable to use a pulsed direct-current (DC) power source with which dust can be reduced and thickness distribution can be evened. The thickness of the oxide semiconductor film is 5 nm to 200 nm. In this embodiment, the oxide semiconductor film has a thickness of 100 nm.

The buffer layers are formed using conductive oxynitride containing indium, gallium, and zinc. The proportion (N/O) of nitrogen (N) to oxygen (O) in oxynitride containing indium, gallium, and zinc which is used for the buffer layers is in the range of greater than or equal to 5 at. % and less than or equal to 80 at. %, preferably in the range of greater than or equal to 10 at. % and less than or equal to 50 at. %. A conductive oxynitride film containing indium, gallium, and zinc, which is used for the buffer layers, can be formed in such a manner that deposition is performed by a sputtering method with use of a target including oxide containing indium, gallium, and zinc in an atmosphere containing nitrogen and heat treatment is performed.

In this embodiment, deposition is performed under a mixed gas atmosphere containing argon and nitrogen under the following conditions: a target having a diameter of 12 inches in which an oxide containing indium, gallium, and zinc is sintered ($In_2O_3$:$Ga_2O_3$:ZnO=1:1:1) is used, the distance between the substrate and the target is 60 mm, the pressure is 0.4 Pa, the direct-current (DC) power source is 0.5 kW. The thickness of the oxynitride film is 2 nm to 100 nm Deposition is performed with a total flow rate of the mixed gas of 40 sccm in which the nitrogen gas is mixed in the range of 1 sccm to 40 sccm. In this embodiment, the thickness of the conductive oxynitride film used for the buffer layers is 5 nm.

Further, it is preferable that the oxynitride film be deposited successively after the deposition of the oxide semiconductor film without exposure to air. In this embodiment, a mode will be described in which the oxide semiconductor film and the oxynitride film are deposited in different chambers with use of a multi-chamber sputtering apparatus in which a plurality of deposition chambers are separated with a load lock chamber and connected through a transfer chamber. Note that the oxide semiconductor film and the oxynitride film can also be deposited in the same chamber under different deposition atmospheres. Specifically, the oxide semiconductor film can be deposited under an atmosphere containing argon or oxygen and the conductive oxynitride film can be deposited under a mixed gas atmosphere containing argon and nitrogen. Alternatively, sputtering may be performed using a target having the same composition under different deposition atmospheres, whereby the oxide semiconductor film and the oxynitride film can be separately formed. When the oxide semiconductor film and the oxynitride film are formed separately in the same chamber under different deposition atmospheres, it is unnecessary to transfer the substrate to another deposition chamber; therefore, manufacturing time can be shortened and a small deposition apparatus can be used. Note that it is preferable to use a pulsed direct-current (DC) power source with which dust can be reduced and thickness distribution can be evened.

When the proportion of nitrogen in the oxynitride film containing indium, gallium, and zinc is too low, carriers are not generated sufficiently even when heat treatment is performed; therefore, the electric conductivity cannot be increased sufficiently. When the proportion of nitrogen in the oxynitride film containing indium, gallium, and zinc is too high, defects are increased even when heat treatment is performed; therefore, the electric conductivity cannot be increased sufficiently. From such a reason, there is an appropriate range of the proportion (N/O) of nitrogen (N) to oxygen (O) in the oxynitride film containing indium, gallium, and zinc which is to be a buffer layer.

The oxynitride film containing indium, gallium, and zinc needs to be subjected to heat treatment after the deposition in order to increase the electric conductivity. The heat treatment is preferably performed at 200° C. to 600° C., typically 300° C. to 500° C. In this embodiment, heat treatment is performed under a nitrogen atmosphere or an air atmosphere in a furnace at 350° C. for 1 hour. Through this heat treatment, rearrangement at the atomic level occurs in an In—Ga—Zn—O—N-based non-single-crystal film included in the oxynitride film. Because strain energy which inhibits carrier movement is released by the heat treatment, the heat treatment (including optical annealing) is important. Note that the heat treatment on the conductive oxynitride film may be performed anytime after the deposition. For example, heat treatment which is to be performed later on the oxide semiconductor film may serve as heat treatment which is performed on the conductive oxynitride film. For example, after a pixel electrode 128 is formed, heat treatment may be performed on the conductive oxynitride film.

Next, with use of a resist mask 131 formed using a second photomask, unnecessary portions of the oxide semiconductor film and the oxynitride film which is to be a buffer layer 114 are removed by etching. In this embodiment, the unnecessary portions are removed by wet etching using ITO07N (product of Kanto Chemical Co., Inc.). Note that the oxide semiconductor film and the oxynitride film which is to be the buffer layer 114 may be etched by either wet etching or dry etching. FIG. 2B is a cross-sectional view at this stage.

Next, a conductive film 105 is formed over the buffer layer 114 and the gate insulating film 102 by a sputtering method or a vacuum evaporation method. The conductive film 105 can be formed using any of the same materials as those of the gate electrode 111. Further, when heat treatment is performed at 200° C. to 600° C., the conductive film preferably has heat-resistant properties to withstand this heat treatment.

In this embodiment, the conductive film 105 has a three-layer structure in which a Ti film is deposited, an aluminum film containing Nd (Al—Nd film) is stacked over the Ti film, and a Ti film is further deposited thereover. Alternatively, the conductive film 105 may have a two-layer structure in which a titanium film is stacked over a film containing aluminum as its main component. Further alternatively, the conductive film 105 may be a single layer of a film containing silicon-containing aluminum as its main component or a single layer of a titanium film. FIG. 2C is a cross-sectional view at this stage.

Next, with use of a resist mask 132 formed using a third photomask, an unnecessary portion of the conductive film 105 is removed by etching to form wirings and electrodes (a signal line, a capacitor wiring, electrodes including the first electrode 115a and the second electrode 115b, and a terminal) (see FIG. 3A). Wet etching or dry etching is used as an etching method at this time. In this embodiment, the first electrode 115a and the second electrode 115b are formed in such a manner that the conductive film in which an Al film and a Ti film are stacked in this order is etched by dry etching using a mixed gas of $SiCl_4$, $Cl_2$, and $BCl_3$ as a reactive gas.

Next, with use of the same resist mask 132 as that used in etching the conductive film 105, the buffer layer 114 is etched. In this embodiment, following the etching of the conductive film, an unnecessary portion of the buffer layer 114 is removed by dry etching to form the buffer layers 114a and 114b. Note that the etching is not limited to dry etching; wet etching may be used. In wet etching, ITO07N (product of Kanto Chemical Co., Inc.) can be used, for example. Although it depends on etching conditions, an exposed region of the oxide semiconductor layer 113 is also etched in the etching step of the buffer layer 114. Accordingly, a part of the oxide semiconductor layer 113 which does not overlap with the buffer layers 114a and 114b has a small thickness as illustrated in FIG. 3A.

Next, the exposed region of the oxide semiconductor layer 113 is subjected to plasma treatment. By the plasma treatment, damage of the oxide semiconductor layer 113 due to the etching can be repaired. The plasma treatment is preferably performed under an atmosphere containing $O_2$ or $N_2O$, preferably under a $N_2$ atmosphere containing oxygen, a He atmosphere containing oxygen, or an Ar atmosphere containing oxygen. Alternatively, the plasma treatment may be performed in an atmosphere where $Cl_2$ and $CF_4$ are added to the above atmosphere. Note that the plasma treatment is preferably performed with no bias applied.

Next, heat treatment is preferably performed at 200° C. to 600° C., typically 300° C. to 500° C. In this embodiment, heat treatment is performed under a nitrogen atmosphere or an air atmosphere in a furnace at 350° C. for 1 hour. Through this heat treatment, rearrangement at the atomic level occurs in the In—Ga—Zn—O-based non-single-crystal film included in the oxide semiconductor film. Because strain energy which inhibits carrier movement is released by the heat treatment, the heat treatment (including optical annealing) is important. Note that there is no particular limitation on the timing of the heat treatment as long as it is after the deposition of the oxide semiconductor film. The heat treatment may be performed, for example, after formation of the pixel electrode 128.

Through the above process, the thin film transistor 150 in which the oxide semiconductor layer 113 is used for a channel formation region can be manufactured.

Next, an interlayer insulating film 109 is formed so as to cover the thin film transistor 150. The interlayer insulating film 109 can be a silicon nitride film, a silicon oxide film, a silicon oxynitride film, an aluminum oxide film, an aluminum nitride film, a tantalum oxide film, or the like, which is obtained by a sputtering method or the like.

Next, with use of a resist mask formed using a fourth photomask in this embodiment, the interlayer insulating film 109 is etched to form contact holes (124 and 125) reaching the wiring and the second electrode 115b, respectively. Note that in order to reduce the number of masks, it is preferable to further etch the gate insulating film 102 using the same resist mask to form a contact hole 126 reaching a wiring 118. FIG. 3B is a cross-sectional view at this stage.

Next, after the resist mask is removed, a transparent conductive film is deposited to serve as the pixel electrode 128. The transparent conductive film is formed using indium oxide ($In_2O_3$), an indium oxide-tin oxide alloy and a tin oxide ($In_2O_3$—$SnO_2$, abbreviated as ITO), or the like by a sputtering method, a vacuum evaporation method, or the like. Etching treatment of such a material is performed with a hydrochloric acid based solution. However, since a residue is easily generated particularly in etching ITO, an indium oxide-zinc oxide alloy ($In_2O_3$—$ZnO$) may be used to improve etching processability.

Next, with use of a resist mask formed using a fifth photomask, an unnecessary portion of the transparent conductive film is removed by etching to form the pixel electrode 128. In addition, a capacitor wiring 123 and the pixel electrode 128 can form a storage capacitor portion by using the gate insulating film 102 and the interlayer insulating film 109 as dielectrics. Moreover, the transparent conductive film is left in the terminal portion to form an electrode or a wiring used for connection with an FPC or to form a terminal electrode for connection which serves as an input terminal of a source wiring. FIG. 3C is a cross-sectional view at this stage.

When the pixel electrode is thus formed in the thin film transistor, a pixel portion of a display device having an n-channel thin film transistor can be completed. The thin film transistor described in this embodiment has a structure in which the oxide semiconductor layer is electrically connected with the first electrode and the second electrode with the buffer layers which use a conductive oxynitride containing indium, gallium, and zinc and which have higher electric conductivity than the oxide semiconductor layer interposed therebetween. Thus, the thin film transistor can be operated stably, and the function of the display device can be enhanced and the operation thereof can be stabilized. That is, through the steps described in this embodiment, a board for an active matrix display device whose function is enhanced and whose operation is stabilized can be manufactured.

Embodiment 2

In this embodiment, a thin film transistor of a semiconductor device and a manufacturing process thereof will be described. Specifically, a manufacturing process of a pixel portion of a display device including a thin film transistor will be described.

Figure 4A:
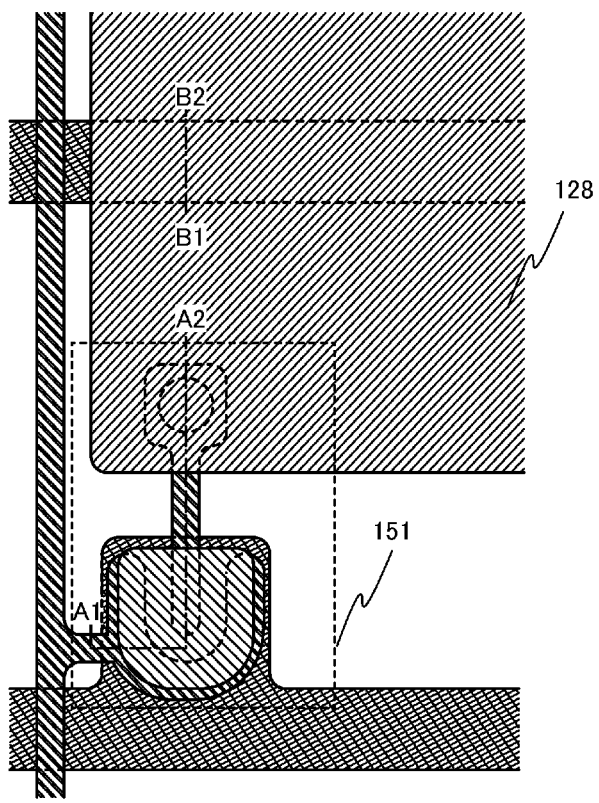
FIGS. 4A and 4B are a top view and a cross-sectional view, respectively, illustrating a semiconductor device of an embodiment of the present invention.
Figure 4B:
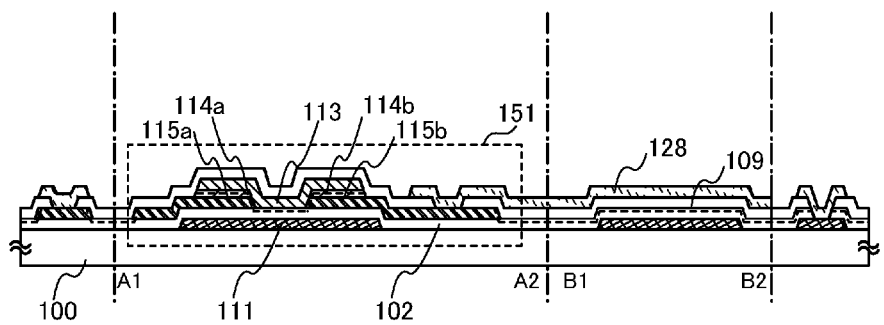

FIGS. 4A and 4B illustrate a thin film transistor of this embodiment. FIG. 4A is a plan view and FIG. 4B is a cross-sectional view taken along line A1-A2 and line B1 and B2 of FIG. 4A.

In a thin film transistor 151 illustrated in FIGS. 4A and 4B, a gate electrode 111 is formed over a substrate 100; a gate insulating film 102 is formed over the gate electrode 111; a first electrode 115a and a second electrode 115b which are to be a source and drain electrodes are formed over the gate insulating film 102 so that an end portion of the first electrode 115a and an end portion of the second electrode 115b overlap with the gate electrode 111. The oxide semiconductor layer 113 is provided so as to overlap with the gate electrode 111 and be in contact with the gate insulating film 102, side surfaces of the first electrode 115a and the second electrode 115b, and side surfaces and top surfaces of buffer layers (114a and 114b) formed over the first electrode 115a and the second electrode 115b.

In other words, the gate insulating film 102 exists in an entire region of the thin film transistor 151 and the gate electrode 111 is provided between the gate insulating film 102 and the substrate 100. The first electrode 115a and the second electrode 115b which are to be a source and drain electrodes and a wiring are provided over the gate insulating film 102; the oxide semiconductor layer 113 is provided over the first electrode 115a and the second electrode 115b; the buffer layer 114a is provided between the oxide semiconductor layer 113 and the first electrode 115a; the buffer layer 114b is provided between the oxide semiconductor layer 113 and the second electrode 115b; and the wiring extends outside a peripheral portion of an oxide semiconductor layer.

In this embodiment, a source and drain regions in the thin film transistor 151 have a structure in which the first electrode 115a, the buffer layer 114a, and the oxide semiconductor layer 113 are stacked from the gate insulating film 102 side and a structure in which the second electrode 115b, the buffer layer 114b, and the oxide semiconductor layer 113 are stacked from the gate insulating film 102 side.

Next, a method for manufacturing the thin film transistor 151 of FIGS. 4A and 4B will be described with reference to FIGS. 5A to 5C and FIGS. 6A to 6C.

The substrate 100 used in this embodiment can be the same substrate as that of Embodiment 1. Further, an insulating film may be formed as a base film.

A conductive film which is to be the gate electrode 111 is formed in a manner similar to that of Embodiment 1. In this embodiment, a conductive film in which a film including aluminum as its main component and a titanium film are stacked by a sputtering method is used as the conductive film which is to be the gate electrode 111. Next, with use of a resist mask formed using a first photomask in this embodiment, an unnecessary portion of the conductive film formed over the substrate 100 is removed by etching to form wirings and an electrode (a gate wiring including the gate electrode 111, a capacitor wiring, and a terminal). At this time, etching is performed so that at least an end portion of the gate electrode 111 is tapered.

The gate insulating film 102 in this embodiment is formed in a manner similar to that of Embodiment 1. In this embodiment, as the gate insulating film 102, a silicon oxide film is deposited to a thickness of 100 nm by a plasma CVD method or a sputtering method.

A conductive film 105 which is to be a wiring and an electrode is formed using a conductive material similar to that of Embodiment 1. The thickness of the conductive film which is to be a source and drain electrodes is preferably greater than or equal to 50 nm and less than or equal to 500 nm. The thickness of less than or equal to 500 nm of the conductive film can prevent disconnection of a semiconductor film and a wiring, which are to be formed later. The conductive film 105 is deposited by a sputtering method or a vacuum evaporation method. In this embodiment, the conductive film 105 has a three-layer structure in which a Ti film is deposited, an aluminum film including Nd (Al—Nd film) is stacked over the Ti film, and a Ti film is further deposited thereover.

Next, a conductive oxynitride film 104 which is to be buffer layers is deposited. It is preferable that the conductive oxynitride film 104 which is to be buffer layers be deposited successively after the deposition of the conductive film 105 without exposure to air. Successive deposition of the conductive film 105 and the conductive oxynitride film 104 can prevent an interface between the conductive film and the conductive oxynitride film 104 which is to be buffer layers from being contaminated by air.

In this embodiment, the conductive oxynitride film 104 which is to be buffer layers is deposited in such manner that a target in which an oxide containing indium, gallium, and zinc is sintered (composition ratio is $In_2O_3:Ga_2O_3:ZnO=1:1:1$) is sputtered under conditions similar to those of Embodiment 1. In this embodiment, the thickness of the conductive oxynitride film used for the buffer layers is 10 nm FIG. 5A is a cross-sectional view at this stage.

The oxynitride film containing indium, gallium, and zinc needs to be subjected to heat treatment after the deposition in order to increase the electric conductivity. The heat treatment is preferably performed at 200° C. to 600° C., typically 300° C. to 500° C. In this embodiment, heat treatment is performed under a nitrogen atmosphere or an air atmosphere in a furnace at 350° C. for 1 hour. Through this heat treatment, rearrangement at the atomic level occurs in the In—Ga—Zn—O—N-based non-single-crystal film included in the oxynitride film. Because strain energy which inhibits carrier movement is released by the heat treatment, the heat treatment (including optical annealing) is important. Note that the heat treatment may be performed anytime after the conductive oxynitride film is deposited. For example, heat treatment which is to be performed later on the oxide semiconductor layer may serve as heat treatment which is performed on the conductive oxynitride film. For example, after a pixel electrode 128 is formed, heat treatment may be performed on the conductive oxynitride film.

Next, with use of a second photomask in this embodiment, a resist mask 131 is formed over the conductive oxynitride film 104 which is to be buffer layers. An unnecessary portion of the conductive oxynitride film 104 is removed by selective etching with use of the resist mask 131 to form the buffer layers (114a and 114b) (see FIG. 5B). Wet etching or dry etching is used as an etching method at this time. In this embodiment, wet etching is performed using ITO07N (product of Kanto Chemical Co., Inc.) to form the buffer layers (114a and 114b).

Next, with use of the same resist mask 131, an unnecessary portion of the conductive film 105 is removed to form the first electrode 115a and the second electrode 115b. In this embodiment, the first electrode 115a and the second electrode 115b are formed in such a manner that a conductive film in which an Al film and a Ti film are stacked in this order is etched by dry etching using a mixed gas of $SiCl_4$, $Cl_2$, and $BCl_3$ as a reactive gas. Note that the etching is not limited to dry etching; wet etching may be used. FIG. 5B is a cross-sectional view at this stage.

Note that before the oxide semiconductor film 103 is formed, plasma treatment may be performed on the buffer layers (114a and 114b) and the gate insulating film 102. In this embodiment, an oxygen gas and an argon gas are introduced into a sputtering apparatus where the substrate has been carried in, and plasma is generated so that an exposed surface of the gate insulating film 102 is subjected to reverse sputtering to be irradiated with oxygen radicals, oxygen or the like. Thus, dust adhering to the surface can be removed.

When the plasma treatment is performed, the oxide semiconductor film 103 containing indium, gallium, and zinc is deposited without exposure of the surface on which the plasma treatment has been performed to air. Deposition of the oxide semiconductor film 103 without exposure to air after the plasma treatment is effective in that dust is not adhered to the interfaces between the buffer layers (114a and 114b) and the oxide semiconductor film 103 or the interface between the gate insulating film 102 and the oxide semiconductor layer 103. Note that the oxide semiconductor film 103 may be deposited in the same chamber as that in which the reverse sputtering has been performed, or may be deposited in a chamber different from that in which the reverse sputtering has been performed as long as it can be deposited without exposure to air.

The oxide semiconductor film 103 is deposited. In this embodiment, the oxide semiconductor film is deposited using an oxide semiconductor target including In, Ga, and Zn and having a diameter of 8 inches (composition ratio is $In_2O_3:Ga_2O_3:ZnO=1:1:1$) under an argon atmosphere or an oxygen atmosphere under the following conditions: the distance between the substrate and the target is 170 mm, the pressure is 0.4 Pa, the direct-current (DC) power source is 0.5 kW. Note that it is preferable to use a pulsed direct-current (DC) power source with which dust can be reduced and thickness distribution can be evened. The thickness of the oxide semiconductor film is 5 nm to 200 nm. In this embodiment, the oxide semiconductor film has a thickness of 100 nm FIG. 5C is a cross-sectional view at this stage.

Next, with use of a resist mask 132 formed using a third photomask, unnecessary portions of the oxide semiconductor film 103 and the buffer layers (114a and 114b) are removed by etching. In this embodiment, the unnecessary portions are removed by wet etching using ITO07N (product of Kanto Chemical Co., Inc.). Note that the etching of the oxide semiconductor film 103 and the buffer layers (114a and 114b) is not limited to wet etching; dry etching may be used. FIG. 6A is a cross-sectional view at this stage.

Next, in a manner similar to that of Embodiment 1, plasma treatment is performed on the oxide semiconductor layer 113. By the plasma treatment, damage of a back channel portion of the oxide semiconductor layer 113 can be repaired.

Next, in a manner similar to that of Embodiment 1, heat treatment is preferably performed at 200° C. to 600° C., typically, 300° C. to 500° C. Note that there is no particular limitation on the timing of the heat treatment as long as it is after the formation of the oxide semiconductor film. The heat treatment may be performed, for example, after formation of the pixel electrode 128 to be formed later.

Through the above process, the thin film transistor 151 in which the oxide semiconductor layer 113 is used for a channel formation region can be manufactured.

Next, in a manner similar to that of Embodiment 1, an interlayer insulating film 109 which covers the thin film transistor 151 is formed.

Next, with use of a resist mask formed using a fourth photomask in this embodiment, the interlayer insulating film 109 is etched to form contact holes (124 and 125) reaching the wiring and the second electrode 115b, respectively. Note that in order to reduce the number of masks, it is preferable to further etch the gate insulating film 102 using the same resist mask to form a contact hole 126 reaching a wiring 118. FIG. 6B is a cross-sectional view at this stage.

Next, in a manner similar to that of Embodiment 1, after the resist mask is removed, a transparent conductive film is deposited to serve as the pixel electrode 128.

Next, in a manner similar to that of Embodiment 1, with use of a resist mask formed using a fifth photomask, an unnecessary portion of the transparent conductive film is removed by etching to form the pixel electrode 128. In addition, a storage capacitor portion and a terminal electrode are formed. FIG. 6C is a cross-sectional view at this stage.

When the pixel electrode is thus formed in the thin film transistor, a pixel portion of a display device having an n-channel thin film transistor can be completed. The thin film transistor described in this embodiment has a structure in which the oxide semiconductor layer is electrically connected with the first electrode and the second electrode with the buffer layers which use a conductive oxynitride containing indium, gallium, and zinc and which have higher electric conductivity than the oxide semiconductor layer interposed therebetween. Thus, the thin film transistor can be operated stably, the function of the display device can be enhanced and the operation thereof can be stabilized. That is, through the steps described in this embodiment, a board for an active matrix display device whose function is enhanced and whose operation is stabilized can be manufactured.

Embodiment 3

Here, an example in which an inverter circuit is formed using two n-channel thin film transistors which are formed in a manner similar to that of Embodiment 2 will be described below as an embodiment of the present invention.

A driver circuit for driving a pixel portion is formed using an inverter circuit, a capacitor, a resistor, and the like. When two n-channel TFTs are combined to form an inverter circuit, there are two types of combinations: a combination of an enhancement type transistor and a depletion type transistor (hereinafter, a circuit formed by such a combination is referred to as an "EDMOS circuit") and a combination of enhancement type TFTs (hereinafter, a circuit formed by such a combination is referred to as an "EEMOS circuit"). Note that when the threshold voltage of the n-channel TFT is positive, the n-channel TFT is defined as an enhancement type transistor, while when the threshold voltage of the n-channel TFT is negative, the n-channel TFT is defined as a depletion type transistor, and this specification follows the above definitions.

The pixel portion and the driver circuit are formed over the same substrate. In the pixel portion, on and off of voltage application to a pixel electrode are switched using enhancement type transistors arranged in a matrix. These enhancement type transistors arranged in the pixel portion are transistors according to an embodiment of the present invention which use an oxide semiconductor. Since the enhancement type transistor has electric characteristics such as an on/off ratio of greater than or equal to $10^9$ at a gate voltage of ±20 V, leakage current is small and low power consumption drive can be realized.

Figure 24A:
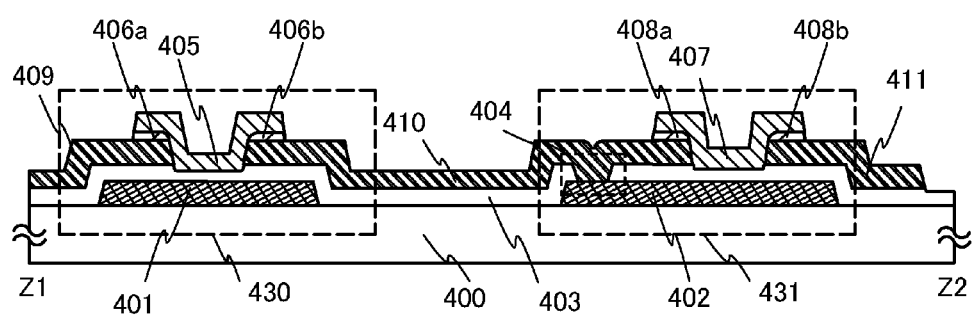
FIG. 24A, FIG. 24B, and FIG. 24C are a cross-sectional view, an equivalent circuit diagram, and a top view, respectively, illustrating a semiconductor device of an embodiment of the present invention.

FIG. 24A illustrates a cross-sectional structure of the inverter circuit of the driver circuit. In FIG. 24A, a first gate electrode 401 and a second gate electrode 402 are provided over a substrate 400. The first gate electrode 401 and the second gate electrode 402 can be formed to have a single-layer structure or a stacked-layer structure using a metal material such as molybdenum, titanium, chromium, tantalum, tungsten, aluminum, copper, neodymium, or scandium, or an alloy material containing any of these materials as the main component.

For example, as a conductive film which is applied for the first gate electrode 401 and the second gate electrode 402, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Further, a first wiring 409, a second wiring 410, and a third wiring 411 are provided over a gate insulating film 403 which covers the first gate electrode 401 and the second gate electrode 402 and the second wiring 410 is directly connected to the second gate electrode 402 through a contact hole 404 formed in the gate insulating film 403.

Further, a first oxide semiconductor layer 405 is provided over the first wiring 409 and the second wiring 410 with buffer layers (406a and 406b) interposed therebetween so as to overlap with the first gate electrode 401 and a second oxide semiconductor layer 407 is provided over the second wiring 410 and the third wiring 411 with buffer layers (408a and 408b) interposed therebetween so as to overlap with the second gate electrode 402.

Note that before the first oxide semiconductor layer 405 or the second oxide semiconductor layer 407 is formed, plasma treatment is preferably performed on surfaces of the buffer layers including indium, gallium, zinc, oxygen, and nitrogen and exposed surfaces of the gate insulating film 403. For example, before an oxide semiconductor film is deposited by a sputtering method, a reverse sputtering is preferably performed in which an argon gas is introduced and plasma is generated to remove dust adhering to the exposed surfaces of the gate insulating film 403 and a bottom surface of the contact hole 404. The reverse sputtering is a method in which voltage is applied to a substrate side, not to a target side, using a RF power source in an argon atmosphere and plasma is generated so that a substrate surface is modified. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added. Note that as illustrated in FIG. 24A, the gate insulating film 403 and the buffer layers (406a, 406b, 408a, and 408b) on which the reverse sputtering has been performed become slightly thin by the surfaces being shaved or the edge portions become rounded in some cases.

A first thin film transistor 430 includes the first gate electrode 401 and the first oxide semiconductor layer 405 which overlaps with the first gate electrode 401 with the gate insulating film 403 interposed therebetween. The first wiring 409 is a power supply line at a ground potential (a ground power supply line). This ground potential power supply line may be a power supply line to which negative voltage VDL is applied (a negative power supply line).

In addition, a second thin film transistor 431 includes the second gate electrode 402 and the second oxide semiconductor layer 407 which overlaps with the second gate electrode 402 with the gate insulating film 403 interposed therebetween, and the third wiring 411 is a power supply line to which a positive voltage VDD is applied (a positive power supply line).

As illustrated in FIG. 24A, the second wiring 410 which is electrically connected to both the first oxide semiconductor layer 405 and the second oxide semiconductor layer 407 is directly connected to the second gate electrode 402 of the second thin film transistor 431 through the contact hole 404 formed in the gate insulating film 403. By the direct connection between the second wiring 410 and the second gate electrode 402, favorable contact can be obtained, which leads to a reduction in contact resistance. In comparison with the case where the second gate electrode 402 and the second wiring 410 are connected to each other with another conductive film, e.g., a transparent conductive film interposed therebetween, a reduction in the number of contact holes and a reduction in an area occupied due to the reduction in the number of contact holes can be achieved.

Figure 24B:
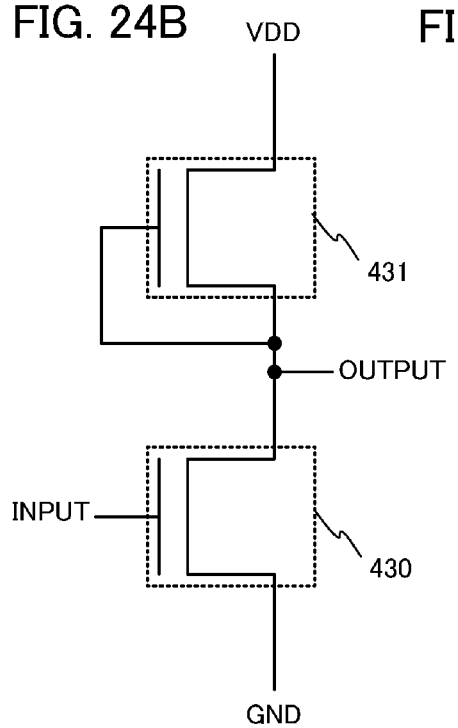
Figure 24C:
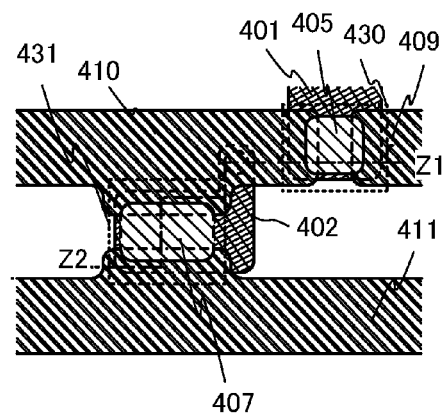

Further, FIG. 24C is a top view of the inverter circuit of the driver circuit. In FIG. 24C, a cross section taken along the chain line Z1-Z2 corresponds to FIG. 24A.

Further, FIG. 24B illustrates an equivalent circuit of the EDMOS circuit. The circuit connection illustrated in FIGS. 24A and 24C corresponds to that illustrated in FIG. 24B. An example in which the first thin film transistor 430 is an enhancement type n-channel transistor and the second thin film transistor 431 is a depletion type n-channel transistor is illustrated.

In order to manufacture an enhancement type n-channel transistor and a depletion type n-channel transistor over the same substrate, for example, the first oxide semiconductor layer 405 and the second oxide semiconductor layer 407 are formed using different materials or under different conditions. Alternatively, an EDMOS circuit may be formed in such a manner that gate electrodes are provided over and under the oxide semiconductor layer to control the threshold value and a voltage is applied to the gate electrodes so that one of the TFTs is normally on while the other TFT is normally off.

Since the inverter circuit of this embodiment uses a thin film transistor in which contact resistance is reduced and the contact resistance is reduced by reduction in the number of contact holes, the inverter circuit is excellent in operation characteristics. In addition, the occupied area can be reduced by reduction in the number of contact holes.

Embodiment 4

In this embodiment, an example of electronic paper will be described as a display device which is an example of a semiconductor device of the present invention.

Figure 7:
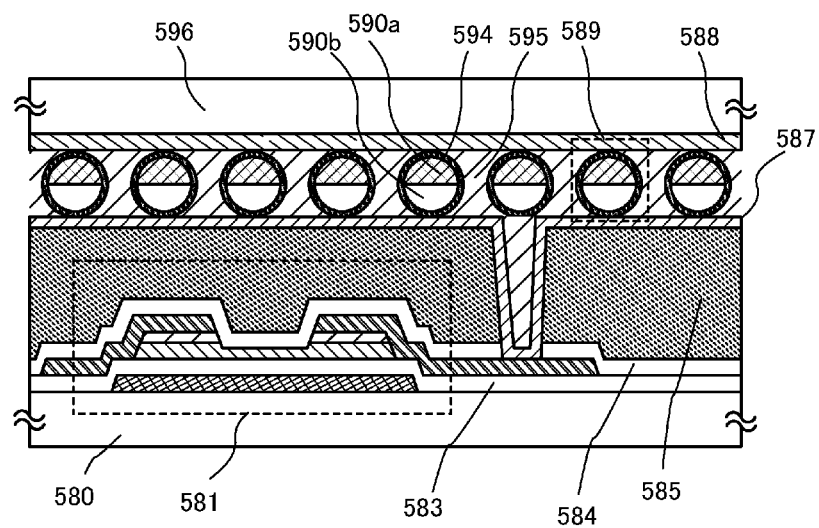
FIG. 7 is a cross-sectional view illustrating electronic paper of an embodiment of the present invention.

FIG. 7 illustrates active matrix electronic paper as an example of a display device to which an embodiment of the present invention is applied. A thin film transistor 581 used for a display device can be manufactured in a manner similar to that of Embodiment 1 and is a thin film transistor in which contact resistance between a source electrode layer and a drain electrode layer and an oxide semiconductor layer is small and which is excellent in operation stability.

The electronic paper in FIG. 7 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The source electrode layer or the drain electrode layer of the thin film transistor 581 is in contact with and electrically connected to a first electrode layer 587 through an opening formed in an insulating layer 585. Between the first electrode layer 587 and a second electrode layer 588, spherical particles 589 each having a black region 590a, a white region 590b, and a cavity 594 around the black region 590a and the white region 590b which is filled with liquid are provided. A space around the spherical particles 589 is filled with a filler 595 such as a resin (see FIG. 7). Note that in FIG. 7, reference numeral 580 denotes a substrate, reference numeral 583 denotes an interlayer insulating film, reference numeral 584 denotes a protective film, and reference numeral 596 denotes a substrate.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source which serves as a power supply.

Through the above process, electronic paper mounted with a thin film transistor which is excellent in operation stability can be manufactured. Electronic paper of this embodiment has high reliability since it is mounted with a thin film transistor which is excellent in operation stability.

This embodiment can be combined with any structure described in Embodiment 1 or 2, as appropriate.

Embodiment 5

In this embodiment, an example will be described below, in which at least part of a driver circuit and a thin film transistor arranged in a pixel portion are formed over the same substrate for a display device which is an example of a semiconductor device of the present invention, with reference to FIGS. 8A and 8B, FIG. 9, FIG. 10, FIG. 11, FIG. 12, and FIG. 13.

The thin film transistor to be arranged over the same substrate is formed in a manner similar to that of Embodiment 1 or 2 as an example. Further, the thin film transistor which is formed is an n-channel TFT, and thus a part of a driver circuit that can include an n-channel TFT among driver circuits is formed over the same substrate as the thin film transistor of the pixel portion.

Figure 8A:
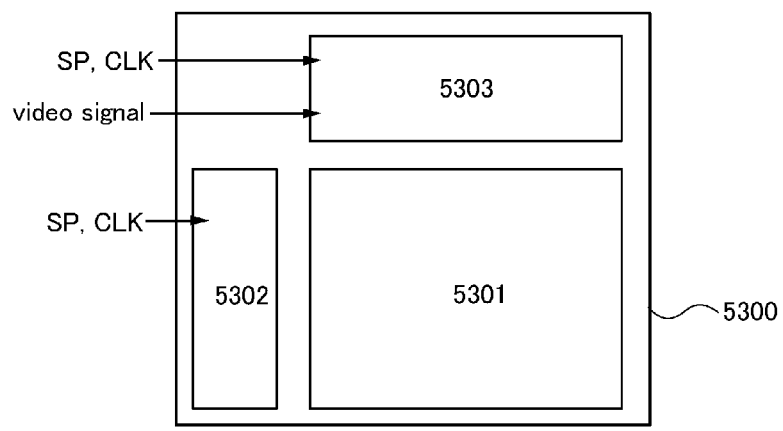
FIGS. 8A and 8B are block diagrams each illustrating a semiconductor device of an embodiment of the present invention.

FIG. 8A illustrates an example of a block diagram of an active matrix liquid crystal display device which is an example of a semiconductor device of the present invention. The display device illustrated in FIG. 8A includes, over a substrate 5300, a pixel portion 5301 including a plurality of pixels that are provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gi (one of the scan lines G1 to Gn).

In addition, the thin film transistor which can be formed in a manner similar to that of Embodiment 1 or 2 is an n-channel TFT, and a signal line driver circuit including the n-channel TFT will be described with reference to FIG. 9.

Figure 9:
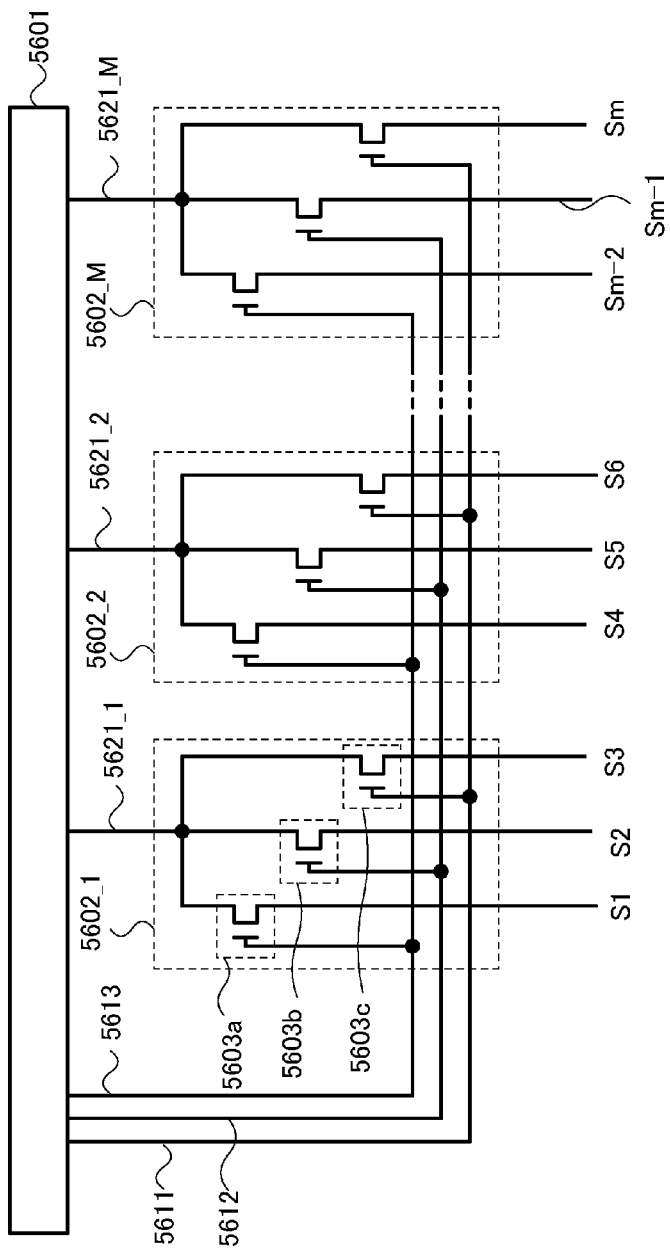
FIG. 9 is a diagram illustrating a configuration of a signal line driver circuit.

The signal line driver circuit illustrated in FIG. 9 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are includes in the switch group 5602_J.

A signal is input to each of the first wiring 5611, the second wiring 5612, and the third wiring 5613.

Note that the driver IC 5601 is preferably formed over a single crystal substrate. The switch groups 5602_1 to 5602_M are preferably formed over the same substrate as the pixel portion is. Therefore, the driver IC 5601 and the switch groups 5602_1 to 5602_M are preferably connected through an FPC or the like.

Figure 10:
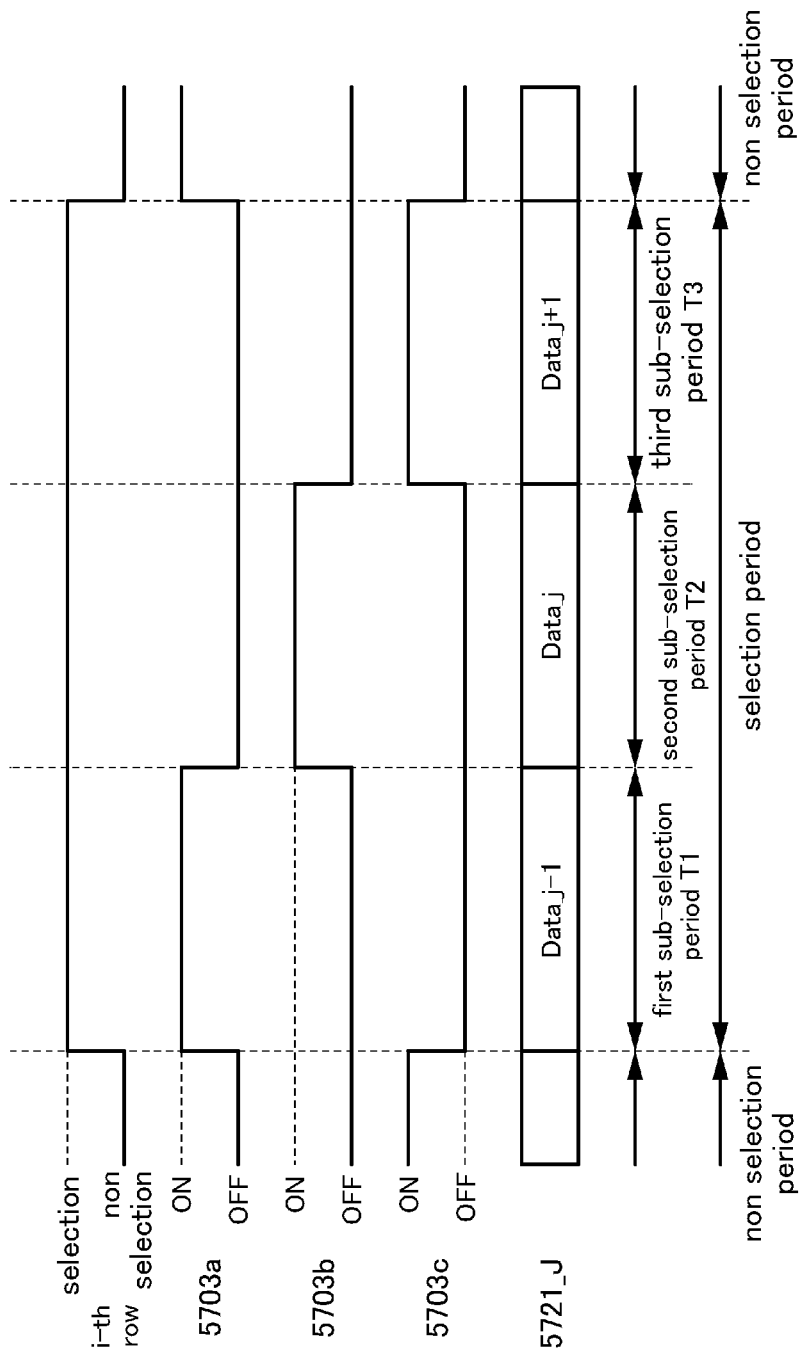
FIG. 10 is a timing chart illustrating operation of a signal line driver circuit.

Next, operation of the signal line driver circuit illustrated in FIG. 9 will be described with reference to a timing chart in FIG. 10. The timing chart in FIG. 10 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 9 operates similarly to that in FIG. 10 even when a scan line of another row is selected.

Note that the timing chart in FIG. 10 shows a case where the wiring 5621_J in the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 10 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_) in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Data_j−1, Data_j, and Data_j+1.

As illustrated in FIG. 10, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 9, by dividing one gate selection period into three, video signals can be input to three signal lines from one wiring 5621 in one gate selection period. Therefore, in the signal line driver circuit in FIG. 9, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 9 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 9.

For example, when video signals are input to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 11:
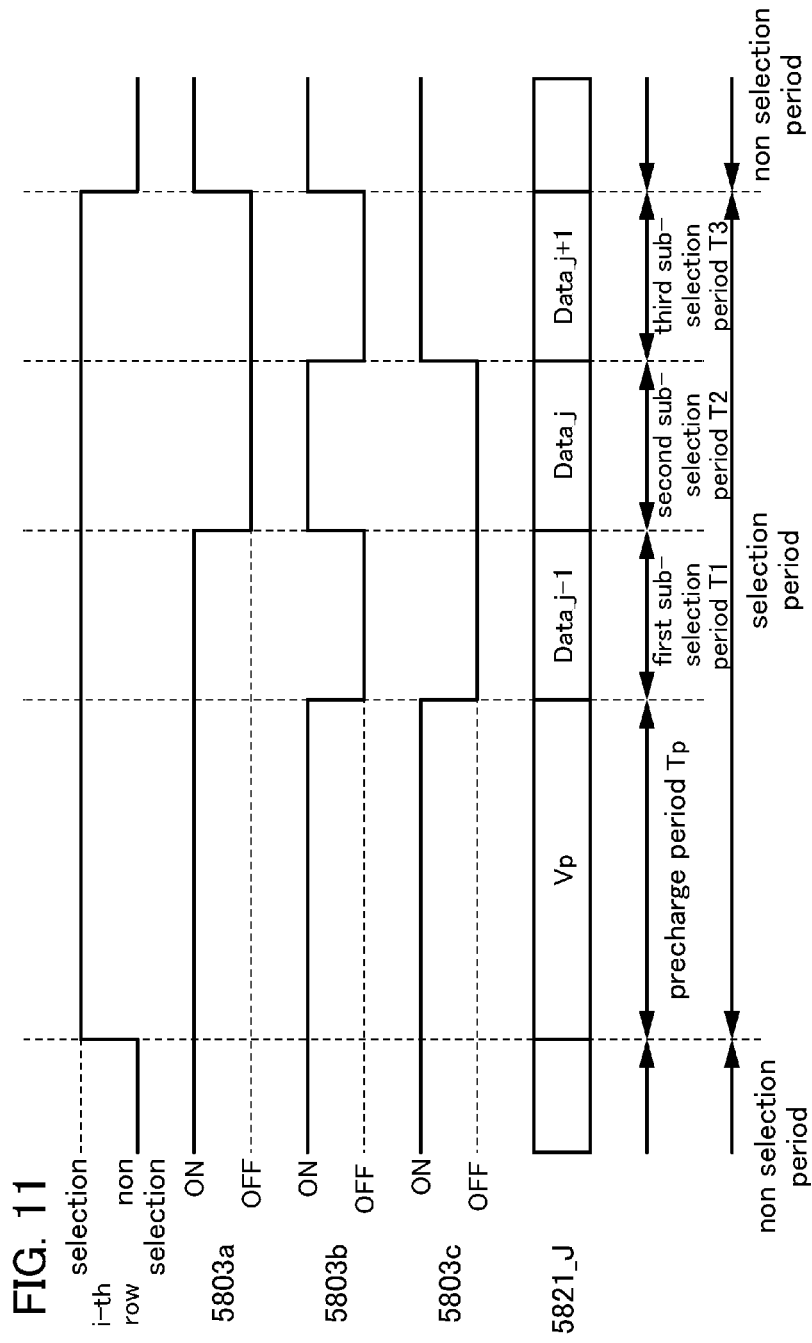
FIG. 11 is a timing chart illustrating operation of a signal line driver circuit.

As another example, one gate selection period may be divided into four periods of a precharge period Tp, the first sub-selection period T1, the second sub-selection period T2, and the third sub-selection period T3 as illustrated in a timing chart in FIG. 11. The timing chart in FIG. 11 illustrates timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 11, the first thin film transistor 5603a, the second thin film transistor 5603b, and the third thin film transistor 5603c are turned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 9 to which the timing chart in FIG. 11 is applied, the video signal can be written to the pixel at high speed because the signal line can be precharged by providing a precharge selection period before a sub-selection period. Note that portions in FIG. 11 which are similar to those of FIG. 10 are denoted by common reference numerals and detailed description of the portions which are the same and portions which have similar functions is omitted.

Further, an example of a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The generated selection signal is buffered and amplified by the buffer, and the resulting signal is supplied to a corresponding scan line. Gate electrode layers of transistors in pixels of one line are connected to the scan line. Further, since the transistors in the pixels of one line have to be turned on at the same time, a buffer which can feed a large current is used.

One mode of a shift register which is used for a part of a scan line driver circuit will be described with reference to FIG. 12 and FIG. 13.

Figure 12:
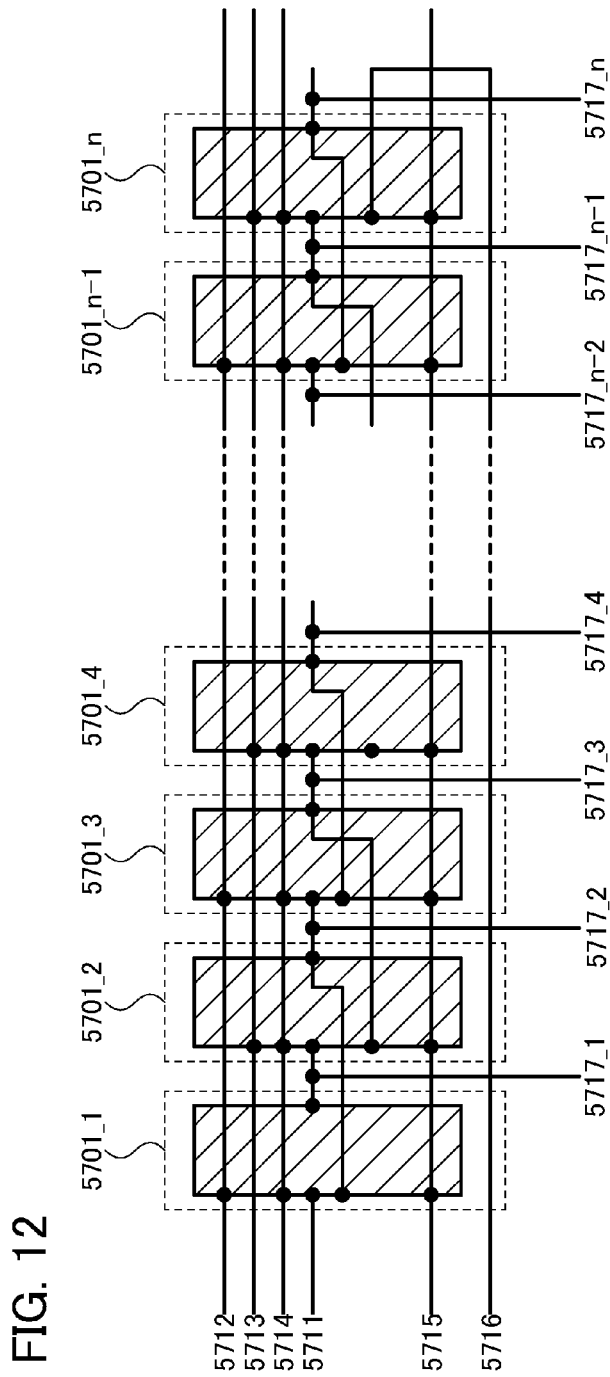
FIG. 12 is a diagram illustrating a configuration of a shift register.

FIG. 12 illustrates a circuit configuration of the shift register. The shift register illustrated in FIG. 12 includes a plurality of flip-flops (flip-flops 5701_1 to 5701_n). The shift register is operated with input of a first clock signal, a second clock signal, a start pulse signal, and a reset signal.

Connection relations of the shift register in FIG. 12 are described. In the i-th stage flip-flop 5701_i (one of the flip-flops 5701_1 to 5701_n) in the shift register of FIG. 12, a first wiring 5501 illustrated in FIG. 13 is connected to a seventh wiring 5717_i−1; a second wiring 5502 illustrated in FIG. 13 is connected to a seventh wiring 5717_i+1; a third wiring 5503 illustrated in FIG. 13 is connected to a seventh wiring 5717_i; and a sixth wiring 5506 illustrated in FIG. 13 is connected to a fifth wiring 5715.

Figure 13:
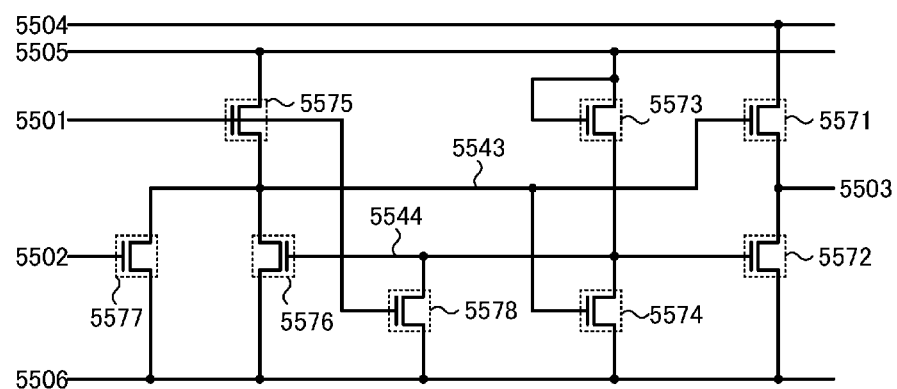
FIG. 13 is a diagram illustrating a connection structure of the flip-flop illustrated in FIG. 11.

Further, a fourth wiring 5504 illustrated in FIG. 13 is connected to a second wiring 5712 in flip-flops of odd-numbered stages, and is connected to a third wiring 5713 in flip-flops of even-numbered stages. A fifth wiring 5505 illustrated in FIG. 13 is connected to a fourth wiring 5714.

Note that the first wiring 5501 of the first stage flip-flop 5701_1 illustrated in FIG. 13 is connected to a first wiring 5711. Moreover, the second wiring 5502 of the n-th stage flip-flop 5701_n illustrated in FIG. 13 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 13 illustrates details of the flip-flop illustrated in FIG. 12. A flip-flop illustrated in FIG. 13 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flop illustrated in FIG. 13 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode layer of the second thin film transistor 5572. A gate electrode layer of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode layer of the second thin film transistor 5572. A gate electrode layer of the fourth thin film transistor 5574 is connected to a gate electrode layer of the first thin film transistor 5571.

A first electrode of the fifth thin film transistor 5575 is connected to the fifth wiring 5505. A second electrode of the fifth thin film transistor 5575 is connected to the gate electrode layer of the first thin film transistor 5571. A gate electrode layer of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode layer of the first thin film transistor 5571. A gate electrode layer of the sixth thin film transistor 5576 is connected to the gate electrode layer of the second thin film transistor 5572.

A first electrode of the seventh thin film transistor 5577 is connected to the sixth wiring 5506. A second electrode of the seventh thin film transistor 5577 is connected to the gate electrode layer of the first thin film transistor 5571. A gate electrode layer of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode layer of the second thin film transistor 5572. A gate electrode layer of the eighth thin film transistor 5578 is connected to the first wiring 5501.

Note that the points at which the gate electrode layer of the first thin film transistor 5571, the gate electrode layer of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode layer of the second thin film transistor 5572, the second electrode of the third thin film transistor 5573, the second electrode of the fourth thin film transistor 5574, the gate electrode layer of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs which can be formed in a manner similar to that of Embodiment 1 or 2. The n-channel TFT which can be formed in a manner similar to that of Embodiment 1 or 2 has a high mobility, and thus a driving frequency of a driver circuit can be increased. For example, a scan line driver circuit using the n-channel TFT which can be formed in a manner similar to that of Embodiment 1 or 2 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized. Furthermore, the use of the plurality of scan line driver circuits for output of signals to the same scan line is advantageous in increasing the size of a display device.

Figure 8B:
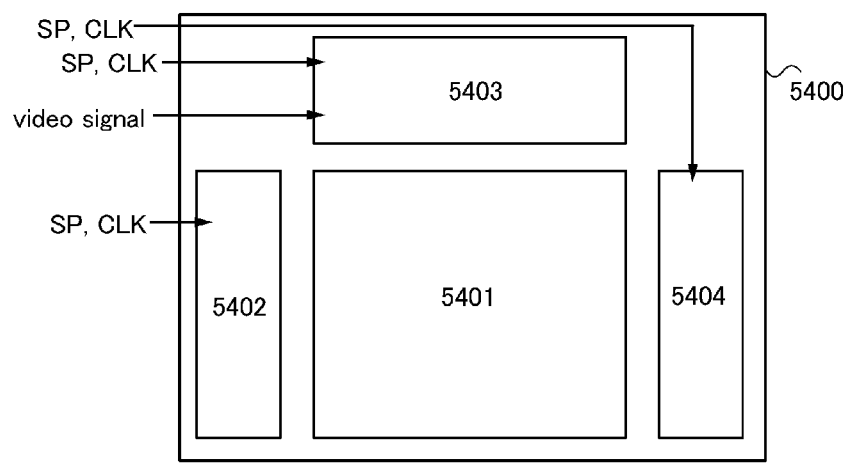

Further, when an active matrix light-emitting display device which is an example of a semiconductor device to which the present invention is applied is manufactured, a plurality of thin film transistors are arranged in at least one pixel, and thus a plurality of scan line driver circuits are preferably arranged. FIG. 8B is a block diagram illustrating an example of an active matrix light-emitting display device.

The light-emitting display device illustrated in FIG. 8B includes, over a substrate 5400, a pixel portion 5401 having a plurality of pixels provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 8B is a digital signal, a pixel emits light or does not emit light by switching of ON/OFF of a transistor. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than that of liquid crystal elements. Specifically, in the case of displaying with a time ratio grayscale method, one frame period is divided into a plurality of subframe periods. Then, in accordance with video signals, the light-emitting element in the pixel is set in a light-emitting state or a non-light-emitting state in each subframe period. By dividing one frame period into a plurality of subframe periods, the total length of time, in which pixels actually emit light in one frame period, can be controlled with video signals so that gray scales are displayed.

In the example of the light-emitting display device illustrated in FIG. 8B, in a case where two switching TFTs are arranged in one pixel, the first scan line driver circuit 5402 generates a signal which is input to a first scan line serving as a gate wiring of one of the switching TFTs, and the second scan line driver circuit 5404 generates a signal which is input to a second scan line serving as a gate wiring of the other of the switching TFTs; however, one scan line driver circuit may generate both the signal which is input to the first scan line and the signal which is input to the second scan line. In addition, for example, there is a possibility that a plurality of the scan lines used for controlling the operation of the switching element are provided in each pixel, depending on the number of switching TFTs included in one pixel. In that case, one scan line driver circuit may generate all signals that are input to the plurality of scan lines, or a plurality of scan line driver circuits may generate signals that are input to the plurality of scan lines.

In addition, also in the light-emitting display device, a part of the driver circuit that can include n-channel TFTs among driver circuits can be formed over the same substrate as the thin film transistors of the pixel portion. Alternatively, the signal line driver circuit and the scan line driver circuit can be formed using only the n-channel TFTs which can be formed in a manner similar to that of Embodiment 1 or 2.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positive-charged and second particles which are negative-charged. By applying an electric field to the microcapsules, the particles in the microcapsules are moved in opposite directions to each other and only the color of the particles concentrated on one side is exhibited. Note that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant moves to a high-electric field region. An electrophoretic display does not need to use a polarizer and a counter substrate, which are required in a liquid crystal display device, and both the thickness and weight of the electrophoretic display device can be a half of those of a liquid crystal display device.

A solution in which the aforementioned microcapsules are dispersed throughout a solvent is referred to as electronic ink. This electronic ink can be printed on a surface of glass, plastic, cloth, paper, or the like. Furthermore, by use of a color filter or particles that have a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the active matrix substrate obtained using the thin film transistor which can be formed in a manner similar to that of Embodiment 1 or 2 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through the above process, a conductive oxynitride layer having higher electric conductivity than an oxide semiconductor layer is provided, whereby a highly reliable display device mounted with a thin film transistor in which the function is enhanced and the operation is stabilized can be manufactured.

This embodiment can be combined with any of the other embodiments as appropriate.

Embodiment 6

In this embodiment, as an example of a semiconductor device of the present invention, a semiconductor device having a display function (also referred to as a display device) can be manufactured using, in a pixel portion and further in a driver circuit, a thin film transistor formed in a manner similar to that of Embodiment 1 or 2. Further, part or whole of a driver circuit can be formed over the same substrate as a pixel portion, using a thin film transistor formed in a manner similar to that of Embodiment 1 or 2, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by a current or a voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention also relates to an element substrate, which corresponds to one mode before the display element is completed in a manufacturing process of the display device, and the element substrate is provided with means for supplying a current to the display element in each of a plurality of pixels. The element substrate may be in a state after only a pixel electrode layer of the display element is formed, a state after a conductive film to be a pixel electrode layer is formed and before the conductive film is etched to form the pixel electrode layer, or any of the other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

In this embodiment, the appearance and the cross section of a liquid crystal display panel which corresponds to a mode of a semiconductor device of the present invention will be described with reference to FIGS. 14A1, 14A2, and 14B. FIGS. 14A1 and 14A2 are each a top view of a panel in which a thin film transistor 4010, a thin film transistor 4011, and a liquid crystal element 4013 formed over a first substrate 4001 are sealed between the first substrate 4001 and the second substrate 4002 with a sealant 4005. FIG. 14B is a cross-sectional view taken along line M-N of FIGS. 14A1 and 14A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001 and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 14A1 illustrates an example of mounting the signal line driver circuit 4003 by a COG method, and FIG. 14A2 illustrates an example of mounting the signal line driver circuit 4003 by a TAB method.

The pixel portion 4002 and the scan line driver circuit 4004 provided over the first substrate 4001 each include a plurality of thin film transistors. FIG. 14B illustrates, as an example, the thin film transistor 4010 included in the pixel portion 4002 and the thin film transistor 4011 included in the scan line driver circuit 4004. Insulating layers 4020 and 4021 are provided over the thin film transistors 4010 and 4011.

As the thin film transistors 4010 and 4011, thin film transistors described in Embodiment 1 or 2 can be employed, for example. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 are overlapped with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the thin film transistor 4010, through conductive particles. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while the temperature of a cholesteric liquid crystal is increased. Since the blue phase is only generated within a narrow range of temperature, the liquid crystal layer 4008 is formed using a liquid crystal composition containing a chiral agent at 5 wt % or more in order to improve the temperature range. The liquid crystal composition which includes a liquid crystal showing a blue phase and a chiral agent has small response times of 10 μs to 100 μs, has optical isotropy, which makes the alignment process unneeded, and has a small viewing angle dependence.

Although an example of a transmissive liquid crystal display device is described in this embodiment, an embodiment of the present invention can also be applied to a reflective liquid crystal display device or a transflective liquid crystal display device.

In this embodiment, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The layered structure of the polarizing plate and the coloring layer is not limited to that described in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor and to improve the reliability of the thin film transistor, the thin film transistor obtained in Embodiment 2 is covered with the insulating layers (the insulating layer 4020 and the insulating layer 4021) serving as a protective film or a planarizing insulating film. Note that the protective film is provided to prevent entry of contaminating impurities floating in the air, such as an organic substance, a metal substance, or water vapor, and is preferably a dense film. The protective film may be formed by a sputtering method to have a single-layer structure of a silicon oxide film, a silicon nitride film, a silicon oxynitride film, a silicon nitride oxide film, an aluminum oxide film, an aluminum nitride film, an aluminum oxynitride film, or an aluminum nitride oxide film, or a layered structure including any of the above films. Although this embodiment describes an example of forming the protective film by a sputtering method, the present invention is not limited to this method and any of a variety of methods may be employed.

In this embodiment, the insulating layer 4020 having a layered structure is formed as the protective film. As a first layer of the insulating layer 4020, a silicon oxide film is formed by a sputtering method. The use of the silicon oxide film as the protective film has an effect of preventing a hillock of an aluminum film used for the source and drain electrode layers.

In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electrical characteristics of the TFT.

Further, after the protective film is formed, the oxide semiconductor layer containing indium, gallium, and zinc may be subjected to annealing (300° C. to 400° C.).

The insulating layer 4021 is formed as the planarizing insulating film. For the insulating layer 4021, an organic material having heat resistance, such as polyimide, acrylic, benzocyclobutene, polyamide, or epoxy, can be used. Alternatively, used may be a low-dielectric constant material (a low-k material), a siloxane-based resin, PSG (phosphosilicate glass), BPSG (borophosphosilicate glass), or the like. A siloxane-based resin may include, as a substituent, an organic group (e.g., an alkyl group, and an aryl group) or a fluoro group. The organic group may include a fluoro group. Note that the insulating layer 4021 may be formed by stacking a plurality of insulating films formed using these materials.

Note that a siloxane-based resin is a resin formed from a siloxane-based material as a starting material and having the bond of Si—O—Si.

There is no particular limitation on the method for forming the insulating layer 4021, and the insulating layer 4021 can be formed, depending on the material, by a sputtering method, an SOG method, spin coating, dipping, spray coating, a droplet discharging method (e.g., an ink-jet method, screen printing, or offset printing), doctor knife, roll coater, curtain coater, knife coater, or the like. In the case of forming the insulating layer 4021 using a material solution, annealing (300° C. to 400° C.) of the oxide semiconductor layer containing indium, gallium, and zinc may be performed at the same time as a baking step. The baking step of the insulating layer 4021 also serves as annealing of the oxide semiconductor layer containing indium, gallium, and zinc, whereby a semiconductor device can be manufactured efficiently.

The pixel electrode layer 4030 or the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode layer formed using the conductive composition has preferably a sheet resistance of less than or equal to 10000 Ω/square and a transmittance of greater than or equal to 70% at a wavelength of 550 nm. Furthermore, the resistivity of the conductive high molecule contained in the conductive composition is preferably less than or equal to 0.1Ω·cm.

As the conductive high molecule, a so-called π-electron conjugated conductive high molecule can be used. For example, it is possible to use polyaniline or a derivative thereof, polypyrrole or a derivative thereof, polythiophene or a derivative thereof, or a copolymer of two or more kinds of them.

In addition, a variety of signals and a potential are supplied to the signal line driver circuit 4003 that is formed separately, and the scan line driver circuit 4004 or the pixel portion 4002 from an FPC 4018.

In this embodiment, a connecting terminal electrode 4015 is formed using the same conductive film as that of the pixel electrode layer 4030 included in the liquid crystal element 4013, and a terminal electrode 4016 is formed using the same conductive film as that of source and drain electrode layers of the thin film transistors 4010 and 4011.

The connecting terminal electrode 4015 is electrically connected to a terminal included in the FPC 4018 through an anisotropic conductive film 4019.

FIGS. 14A1, 14A2, and 14B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 15:
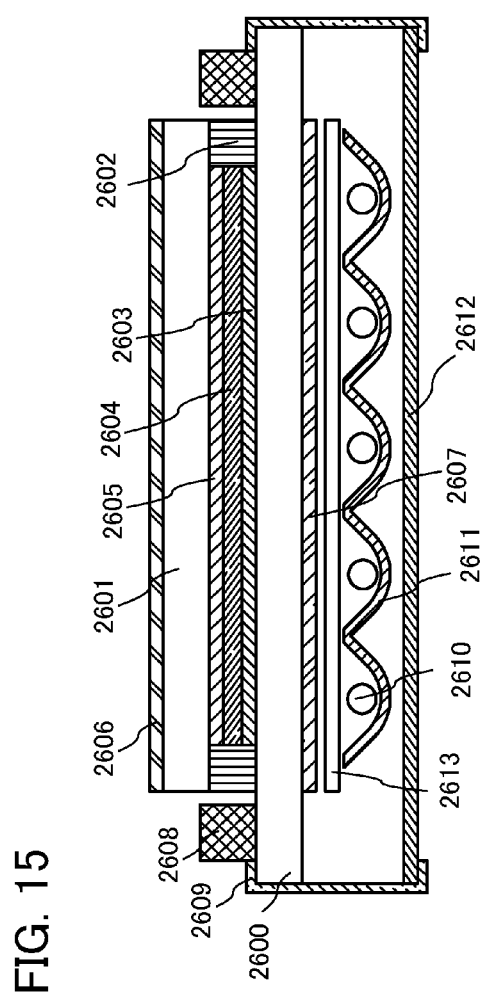
FIG. 15 is a cross-sectional view illustrating a semiconductor device of an embodiment of the present invention.

FIG. 15 illustrates an example of a liquid crystal display module which is formed as a semiconductor device by using a TFT substrate 2600 manufactured by applying an embodiment of the present invention.

FIG. 15 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a display device mounted with a thin film transistor which is excellent in operation stability can be manufactured. A liquid crystal display device of this embodiment is mounted with a thin film transistor which is excellent in operation stability, and thus has high reliability.

This embodiment can be implemented in appropriate combination with any of the structures described in the other embodiments.

Embodiment 7

In this embodiment, a light-emitting display device will be described as an example of a semiconductor device of the present invention. As a display element included in a display device, a light-emitting element utilizing electroluminescence will be described in this embodiment. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 16:
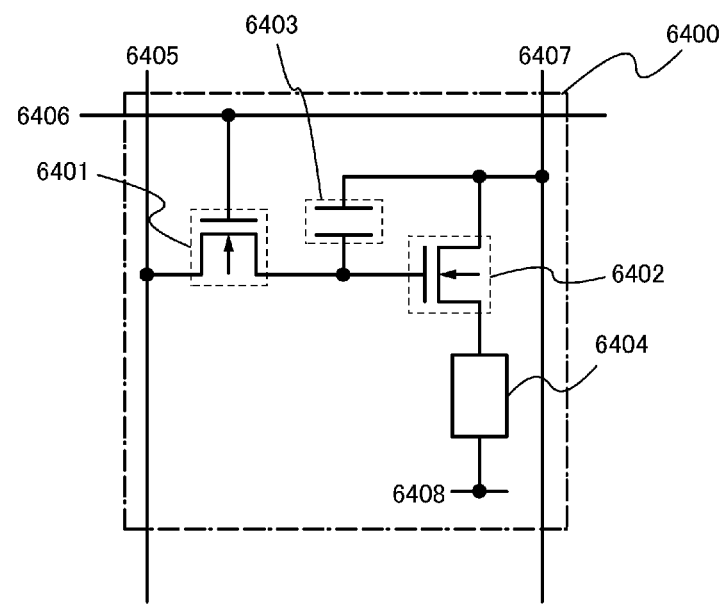
FIG. 16 is a diagram illustrating an equivalent circuit of a pixel of a semiconductor device of an embodiment of the present invention.

FIG. 16 illustrates an example of a pixel structure to which digital time grayscale driving can be applied, as an example of a semiconductor device to which an embodiment of the present invention is applied.

A structure and operation of a pixel to which digital time grayscale driving can be applied will be described. In this embodiment, an example is shown in which one pixel includes two n-channel transistors where an oxide semiconductor layer containing indium, gallium, and zinc described in Embodiment 1 or 2 is used for a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (a pixel electrode layer) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power supply potential. The low power supply potential is lower than a high power supply potential which is supplied to the power supply line 6407. For example, GND or 0 V may be set as the low power supply potential. The difference between the high power supply potential and the low power supply potential is applied to the light-emitting element 6404 to flow current in the light-emitting element 6404, whereby the light-emitting element 6404 emits light. Thus, each potential is set so that the difference between the high power supply potential and the low power supply potential is equal to or higher than a forward threshold voltage.

When the gate capacitance of the driving transistor 6402 is used as a substitute for the capacitor 6403, the capacitor 6403 can be omitted. The gate capacitance of the driving transistor 6402 may be formed between a channel region and a gate electrode layer.

In the case of using a voltage-input voltage driving method, a video signal is input to the gate of the driving transistor 6402 to make the driving transistor 6402 completely turn on or off. That is, the driving transistor 6402 operates in a linear region, and thus, a voltage higher than the voltage of the power supply line 6407 is applied to the gate of the driving transistor 6402. Note that a voltage higher than or equal to (power supply line voltage+$V_{th}$ of the driving transistor 6402) is applied to the signal line 6405.

In the case of performing analog grayscale driving instead of digital time grayscale driving, the same pixel structure as that in FIG. 16 can be used by changing signal input.

In the case of performing analog grayscale driving, a voltage higher than or equal to (forward voltage of the light-emitting element 6404+Vth of the driving transistor 6402) is applied to the gate of the driving transistor 6402. The forward voltage of the light-emitting element 6404 refers to a voltage to obtain a desired luminance, and includes at least a forward threshold voltage. By inputting a video signal to allow the driving transistor 6402 to operate in a saturation region, current can flow in the light-emitting element 6404. In order to allow the driving transistor 6402 to operate in the saturation region, the potential of the power supply line 6407 is higher than a gate potential of the driving transistor 6402. Since the video signal is an analog signal, a current in accordance with the video signal flows in the light-emitting element 6404, and the analog grayscale driving can be performed.

Note that the pixel structure is not limited to that illustrated in FIG. 16. For example, the pixel in FIG. 16 can further include a switch, a resistor, a capacitor, a transistor, a logic circuit, or the like.

Next, structures of the light-emitting element will be described with reference to FIGS. 17A to 17C. In this embodiment, a cross-sectional structure of a pixel will be described by taking an n-channel driving TFT as an example. Driving TFTs 7001, 7011, and 7021 which are used for semiconductor devices of FIGS. 17A, 17B, and 17C, respectively can be manufactured in a manner similar to that of the thin film transistor described in Embodiment 1.

In order to extract light emitted from the light-emitting element, at least one of the anode and the cathode is required to be transparent. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure of an embodiment of the present invention can be applied to a light-emitting element having any of these emission structures.

A light-emitting element having a top emission structure will be described with reference to FIG. 17A.

Figure 17A:
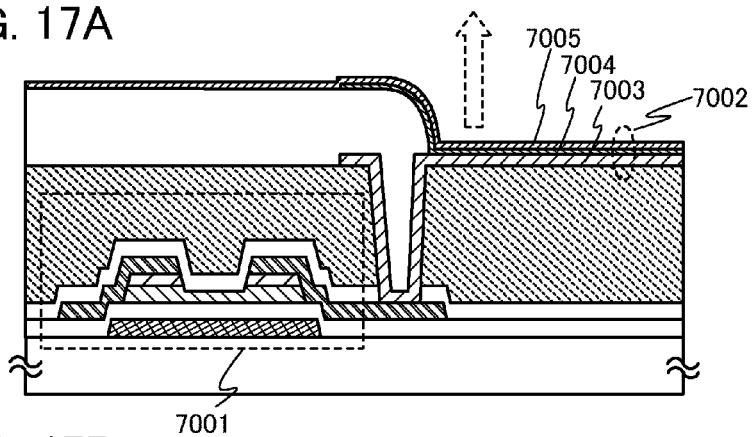
FIGS. 17A to 17C are views each illustrating a semiconductor device of an embodiment of the present invention.

FIG. 17A is a cross-sectional view of a pixel in the case where the driving TFT 7001 is an n-channel TFT and light generated in a light-emitting element 7002 is emitted to an anode 7005 side with respect to a light-emitting layer 7004 (the side opposite to the substrate side). In FIG. 17A, a cathode 7003 of the light-emitting element 7002 is electrically connected to the driving TFT 7001, and a light-emitting layer 7004 and the anode 7005 are stacked in this order over the cathode 7003. The cathode 7003 can be made of a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Not all of these layers need to be provided. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 17A, light is emitted from the light-emitting element 7002 to the anode 7005 side as indicated by an arrow.

Next, a light-emitting element having a bottom emission structure will be described with reference to FIG. 17B. FIG. 20B is a cross-sectional view of a pixel in the case where a driving TFT 7011 is n-channel, and light is emitted from a light-emitting element 7012 to a cathode 7013 side with respect to a light-emitting layer (the substrate side). In FIG. 17B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used, like in the case of FIG. 17A, as long as they are conductive materials having a low work function. Note that the cathode 7013 is formed to have a thickness that can transmit light (preferably, approximately 5 nm to 30 nm). For example, an aluminum film with a thickness of 20 nm can be used as the cathode 7013. Similarly to the case of FIG. 17A, the light-emitting layer 7014 may be formed using either a single layer or a plurality of layers stacked. The anode 7015 is not required to transmit light, but can be made of a light-transmitting conductive material like in the case of FIG. 17A. For the light-blocking film 7016, a metal which reflects light can be used for example; however, it is not limited to a metal film. For example, a resin to which black pigments are added can also be used.

The light-emitting element 7012 corresponds to a region where the cathode 7013 and the anode 7015 sandwich the light-emitting layer 7014. In the case of the pixel illustrated in FIG. 17B, light is emitted from the light-emitting element 7012 to the cathode 7013 side as indicated by an arrow.

Next, a light-emitting element having a dual emission structure will be described with reference to FIG. 17C. In FIG. 17C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. Like in the case of FIG. 17A, the cathode 7023 can be made of a variety of conductive materials as long as they have a low work function. Note that the cathode 7023 is formed to have a thickness that can transmit light. For example, a film of Al having a thickness of 20 nm can be used as the cathode 7023. Like in FIG. 17A, the light-emitting layer 7024 may be formed using either a single layer or a plurality of layers stacked. The anode 7025 can be made of a light-transmitting conductive material like in the case of FIG. 17A.

The light-emitting element 7022 corresponds to a region where the cathode 7023, the light-emitting layer 7024, and the anode 7025 overlap with one another. In the case of the pixel illustrated in FIG. 17C, light is emitted from the light-emitting element 7022 to both the anode 7025 side and the cathode 7023 side as indicated by arrows.

Although an organic EL element is described in this embodiment as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 17B:
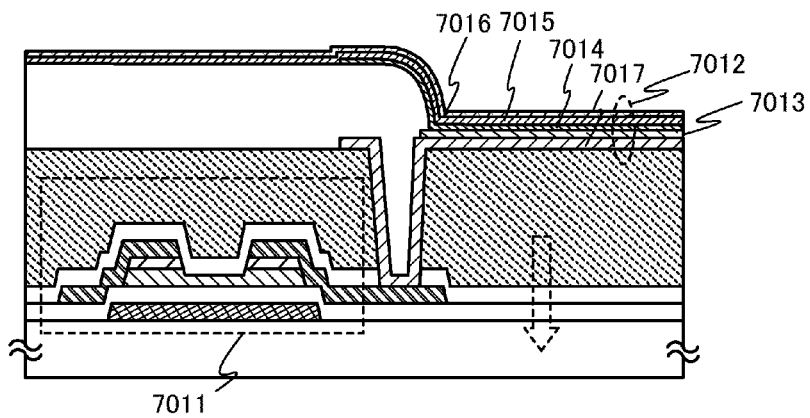
Figure 17C:
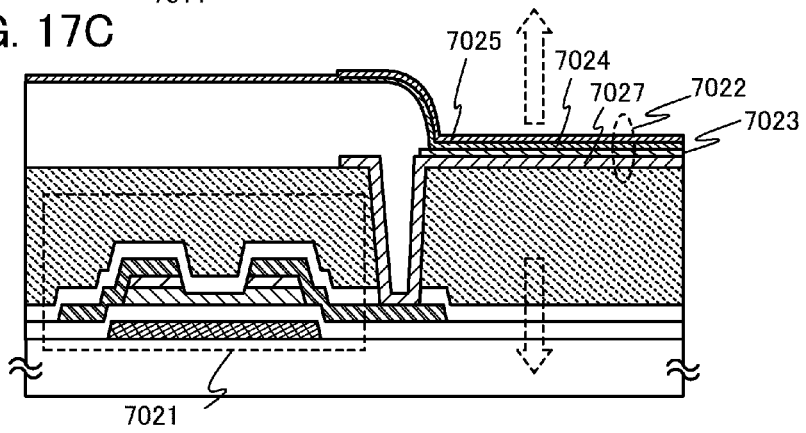

The structure of the semiconductor device described in this embodiment is not limited to those illustrated in FIGS. 17A to 17C and can be modified in various ways based on the spirit of techniques of the present invention.

Next, the appearance and a cross section of a light-emitting display panel (also referred to as a light-emitting panel), which is an embodiment of the semiconductor device of the present invention, will be described with reference to FIGS. 18A and 18B. FIG. 18A is a top view of a panel in which a thin film transistor using an oxide semiconductor layer containing indium, gallium, and zinc which is formed over a first substrate in a manner similar to that of Embodiment 1 and a light-emitting element are sealed between the first substrate and a second substrate with a sealant. FIG. 18B is a cross-sectional view taken along line H-I of FIG. 18A.

A sealant 4505 is provided to surround a pixel portion 4502, signal line driver circuits 4503a and 4503b, and scanning line driver circuits 4504a and 4504b, which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 18B.

The thin film transistors 4509 and 4510 are n-channel thin film transistors and the thin film transistor described in Embodiment 1 can be applied.

Moreover, a first electrode layer 4517 that is a pixel electrode layer included in the light-emitting element 4511 is electrically connected to a source electrode layer or a drain electrode layer of the thin film transistor 4510. Note that a structure of the light-emitting element 4511 is not limited to the stacked structure shown in this embodiment, which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition wall 4520 in order to prevent oxygen, hydrogen, moisture, carbon dioxide, or the like from entering into the light-emitting element 4511. As the protective film, a silicon nitride film, a silicon nitride oxide film, a DLC film, or the like can be formed.

A variety of signals and potentials are supplied to the signal line driver circuits 4503a and 4503b, the scanning line driver circuits 4504a and 4504b, or the pixel portion 4502 from FPCs 4518a and 4518b.

In this embodiment, a connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal of the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 18A and 18B.

Through the above process, a display device mounted with a thin film transistor which is excellent in operation stability can be manufactured. A light-emitting display device (a display panel) of this embodiment is mounted with a thin film transistor which is excellent in operation stability, and thus has high reliability.

This embodiment can be combined with any structure described in the other embodiments, as appropriate.

Embodiment 8

A display device of an embodiment of the present invention can be applied to electronic paper. Electronic paper can be used for electronic devices of a variety of fields as long as they can display data. For example, electronic paper can be applied to an electronic book (e-book) reader, a poster, an advertisement in a vehicle such as a train, displays of various cards such as a credit card, and the like. Examples of the electronic devices are illustrated in FIGS. 19A and 19B and FIG. 20.

Figure 19A:
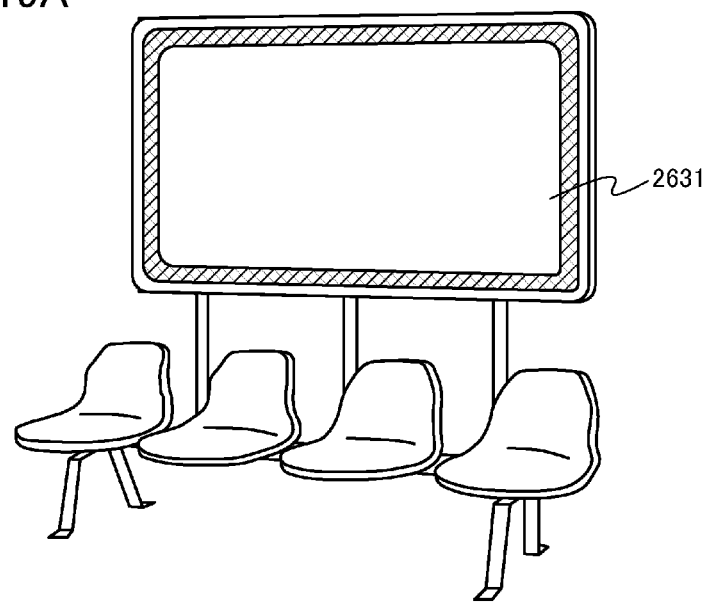
FIGS. 19A and 19B are views each illustrating an example of a usage pattern of electronic paper.

FIG. 19A illustrates a poster 2631 formed using electronic paper. In the case where an advertising medium is printed paper, the advertisement is replaced by manpower; however, by using electronic paper to which an embodiment of the present invention is applied, the advertising display can be changed in a short time. Further, an image can be stably displayed without being distorted. Note that the poster may be configured to transmit and receive data wirelessly.

Figure 19B:
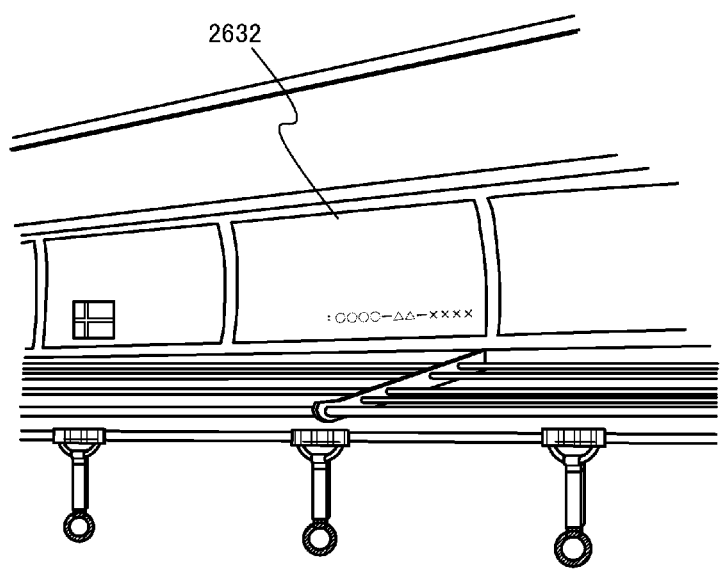

FIG. 19B illustrates an advertisement 2632 in a vehicle such as a train. In the case where an advertising medium is printed paper, the advertisement is replaced by manpower; however, by using electronic paper to which an embodiment of the present invention is applied, the advertising display can be changed in a short time without a lot of manpower. Further, an image can be stably displayed without being distorted. Note that the advertisement may be configured to transmit and receive data wirelessly.

Figure 20:
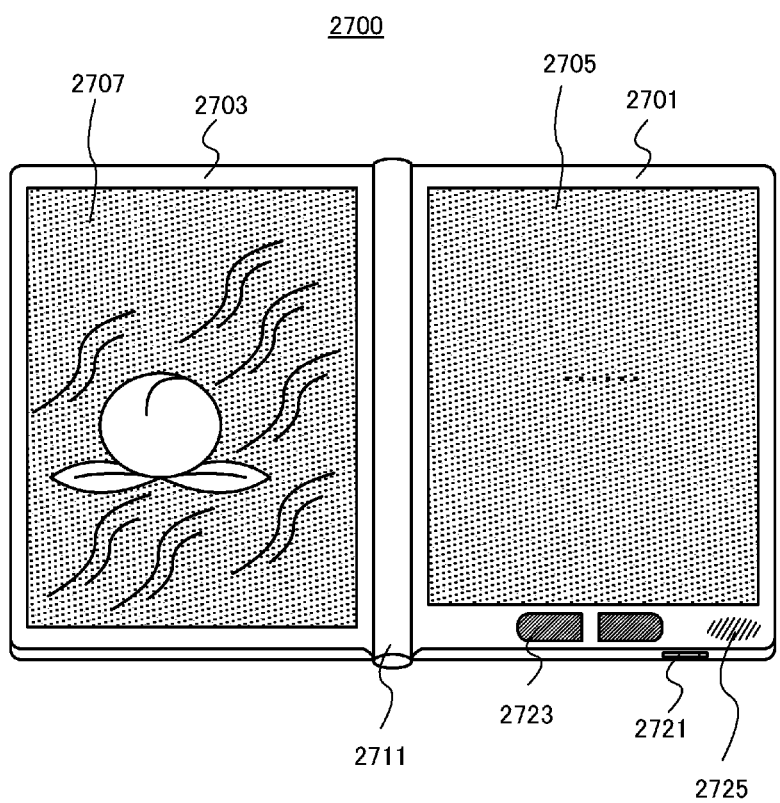
FIG. 20 is an external view illustrating an example of an e-book reader.

FIG. 20 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20) can display text and a display portion on the left side (the display portion 2707 in FIG. 20) can display graphics.

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as an AC adapter and a USB cable, or the like), a recording medium insert portion, and the like may be provided on the back surface or the side surface of the housing. Further, the electronic book reader 2700 may have a function of an electronic dictionary.

The electronic book reader 2700 may transmit and receive data wirelessly. The structure can be employed in which a desired book data or the like is purchased and downloaded from an electronic book server wirelessly.

Through the above process, a display device mounted with a thin film transistor which is excellent in operation stability can be manufactured. The display device mounted with a thin film transistor which is excellent in operation stability has high reliability.

Embodiment 9

A semiconductor device according to an embodiment of the present invention can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 21A:
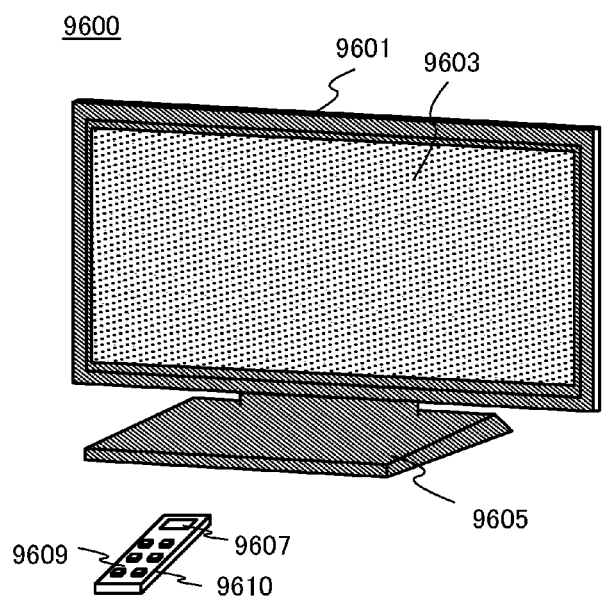
FIGS. 21A and 21B are external views each illustrating an example of a television device and a digital photo frame, respectively.

FIG. 21A illustrates an example of a television set 9600. In the television set 9600, a display portion 9603 is incorporated in a housing 9601. The display portion 9603 can display an image. Further, the housing 9601 is supported by a stand 9605 in this embodiment.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 21B:
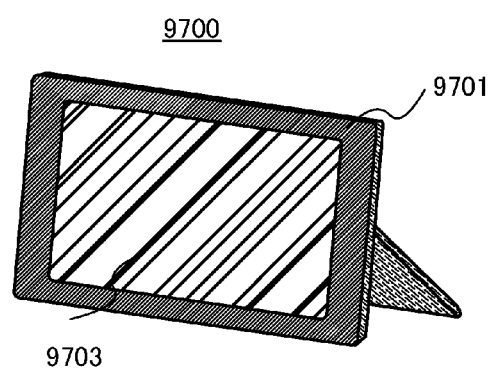

FIG. 21B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and then displayed on the display portion 9703.

The digital photo frame 9700 may transmit and receive data wirelessly. The structure may be employed in which desired image data is transferred wirelessly to be displayed.

Figure 22A:
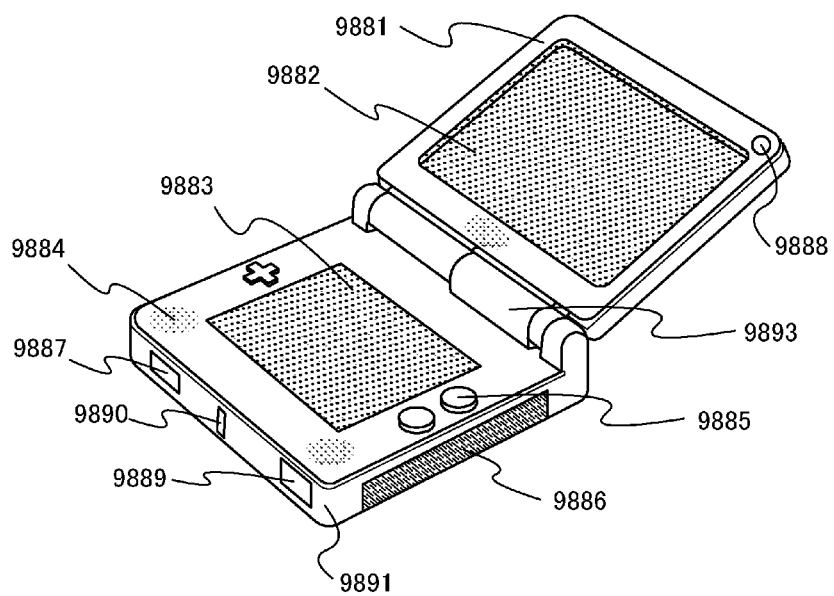
FIGS. 22A and 22B are external views each illustrating an example of an amusement machine.

FIG. 22A is a portable game machine and is constituted by two housings of a housing 9881 and a housing 9891 which are connected with a joint portion 9893 so that the portable game machine can be opened or folded. A display portion 9882 is incorporated in the housing 9881, and a display portion 9883 is incorporated in the housing 9891. In addition, the portable game machine illustrated in FIG. 22A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. Needless to say, the structure of the portable game machine is not limited to the described-above. The portable game machine may have a structure in which additional accessory equipment is provided as appropriate as long as at least the semiconductor device according to an embodiment of the present invention is provided. The portable game machine illustrated in FIG. 22A has a function of reading a program or data stored in the recording medium to display it on the display portion, and a function of sharing information with another portable game machine by wireless communication. Note that a function of the portable game machine illustrated in FIG. 22A is not limited to those described above, and the portable game machine can have a variety of functions.

Figure 22B:
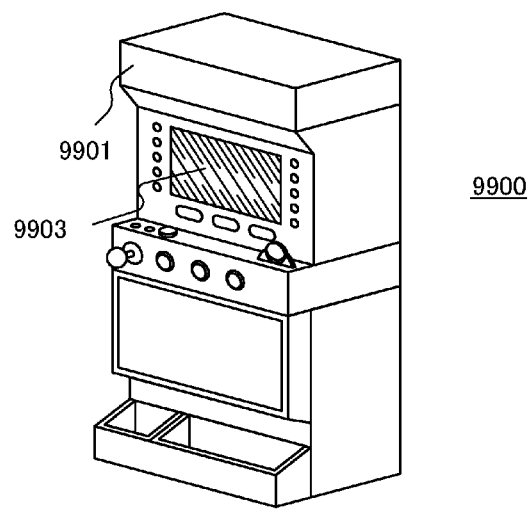

FIG. 22B illustrates an example of a slot machine 9900 which is a large-sized amusement machine. In the slot machine 9900, a display portion 9903 is incorporated in a housing 9901. In addition, the slot machine 9900 is provided with operation means such as a start lever and a stop switch, a coin slot, a speaker, or the like. Needless to say, the structure of the slot machine 9900 is not limited to the above-described structure. The slot machine may have a structure in which additional accessory equipment is provided as appropriate as long as at least the semiconductor device according to an embodiment of the present invention is provided.

Figure 23:
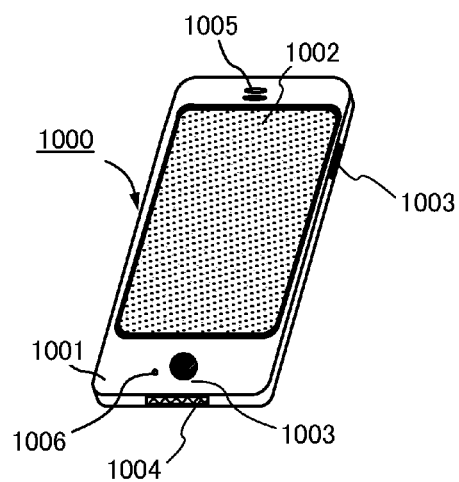
FIG. 23 is an external view illustrating an example of a mobile phone.

FIG. 23 illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 illustrated in FIG. 23 is touched with a finger or the like, data can be input into the mobile phone handset 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display in the screen of the display portion 1002 can be automatically switched by determining the direction of the mobile phone handset 1000 (whether the mobile phone handset 1000 is placed horizontally or vertically for a landscape mode or portrait mode).

The screen modes are switched by touching the display portion 1002 or operating the operation buttons 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

Through the above process, a display device mounted with a thin film transistor which is excellent in operation stability can be manufactured. The above electronic devices each include a thin film transistor which is excellent in operation stability, and thus have high reliability.

Embodiment 10

In this embodiment, in the case of manufacturing a thin film transistor using an oxide semiconductor for a semiconductor layer, a method for reprocessing and reusing an oxide semiconductor from etching waste liquid which is generated in patterning an oxide semiconductor film will be described.

FIG. 25 and FIGS. 26A to 26G show a reusing cycle.

Figure 25:
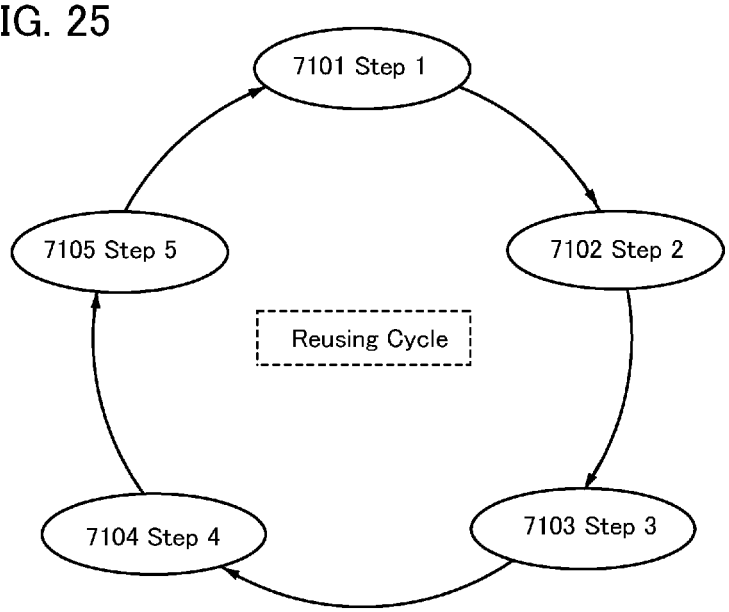
FIG. 25 is a view showing a reusing cycle of an oxide semiconductor included in etching waste liquid.

First, in Step 1 (7101) of FIG. 25, an oxide semiconductor film is deposited by a sputtering method or a pulsed laser deposition method (a laser pulsed deposition method). FIGS. 26A and 26B illustrate a specific example in deposition. In FIG. 26A, a gate electrode 7202 and a gate insulating film 7203 are formed on a substrate 7201 and an oxide semiconductor film 7205 is formed on the gate insulating film 7203 by a sputtering method (FIG. 26B). A target 7204 used at this time is an oxide semiconductor target including In, Ga, and Zn. For example, a target whose composition ratio is In:Ga:Zn=1:1:0.5 can be used.

Next, in Step 2 (7102) of FIG. 25, the oxide semiconductor film is patterned. As illustrated in FIG. 26C, with use of a resist mask 7206 formed using a photomask, an unnecessary portion of the oxide semiconductor film 7205 is removed by a wet etching method. Note that etching of the buffer layer in this specification may be performed at the same time. Thus, an oxide semiconductor film 7207 having a desired shape can be obtained.

Next, in Step 3 (7103) of FIG. 25, etching waste liquid 7208 which is generated in Step 2 (7102) is collected (FIG. 26E). Note that when the etching waste liquid is collected, it may be neutralized. In consideration of favorable workability, processing neutralized etching waste liquid improves safety, which is preferable.

Next, in Step 4 (7104) of FIG. 25, solidification treatment in which moisture is removed from the etching waste liquid is performed, whereby a solid 7209 is obtained (FIG. 26F). Note that in order to remove the moisture, the etching waste liquid may be heated. Further, after the solid 7209 is obtained, composition analysis is performed and the composition ratio is adjusted by addition of a component which is short or the like so that a target which is to be reprocessed in a later step has a desired composition ratio.

Next, in Step 5 (7105) of FIG. 25, the solid 7209 is put in a dice having a desired shape, application of pressure and baking are performed on the solid 7209, whereby a sintered body 7210 is obtained. Further, the sintered body 7210 is attached to a backing plate 7211 with an adhesive to form a target 7212 (FIG. 26G). Note that the baking temperature is preferably greater than or equal to 700° C. The thickness thereof is preferably greater than or equal to 5 nm and less than or equal to 10 nm Note that since the composition ratio of In, Ga, and Zn is adjusted in Step 4 (7104) of FIG. 25, the target 7212 having a desired composition ratio can be obtained.

Note that the obtained target 7212 can be used at the time of deposition in Step 1 (7101) of FIG. 25.

Thus, an oxide semiconductor can be reprocessed from etching waste liquid in the case of manufacturing a thin film transistor in which an oxide semiconductor is used for a semiconductor layer and can be reused.

Note that since it is known that indium or gallium included in an oxide semiconductor is a rare metal, by using a method for reusing an oxide semiconductor which is described in this embodiment, resource saving can be achieved and cost reduction of a product manufactured using an oxide semiconductor can also be achieved.

This application is based on Japanese Patent Application serial no. 2008-287051 filed with Japan Patent Office on Nov. 7, 2008, the entire contents of which are hereby incorporated by reference.

What is claimed is:

1. A thin film transistor comprising:
a gate electrode;
a gate insulating film which covers the gate electrode;
an oxide semiconductor layer which overlaps with the gate electrode with the gate insulating film interposed therebetween;
a first electrode and a second electrode over the oxide semiconductor layer, an end portion of the first electrode and an end portion of the second electrode overlapping with the gate electrode;
a first buffer layer which is in contact with the oxide semiconductor layer and the first electrode and interposed between the oxide semiconductor layer and the first electrode; and
a second buffer layer which is in contact with the oxide semiconductor layer and the second electrode and interposed between the oxide semiconductor layer and the second electrode,
wherein the first buffer layer and the second buffer layer include indium, gallium, zinc, oxygen, and nitrogen.

2. The thin film transistor according to claim 1, wherein a proportion (N/O) of nitrogen (N) to oxygen (O) included in the buffer layers is greater than or equal to 5 at. % and less than or equal to 80 at. %.

3. The thin film transistor according to claim 1, wherein the oxide semiconductor layer contains indium, gallium, and zinc.

4. A thin film transistor comprising:
a gate electrode;
a gate insulating film which covers the gate electrode;
a first electrode and a second electrode, an end portion of the first electrode and an end portion of the second electrode overlapping with the gate electrode with the gate insulating film interposed therebetween;
a first buffer layer over the first electrode;
a second buffer layer over the second electrode; and
an oxide semiconductor layer which overlaps with the end portion of the first electrode and the end portion of the second electrode,
wherein the oxide semiconductor layer is in contact with side surfaces of the first electrode and the second electrode and top surfaces and side surfaces of the first buffer layer and the second buffer layer; and
wherein the first buffer layer and the second buffer layer contain indium, gallium, zinc, oxygen, and nitrogen.

5. The thin film transistor according to claim 4, wherein a proportion (N/O) of nitrogen (N) to oxygen (O) included in the buffer layers is greater than or equal to 5 at. % and less than or equal to 80 at. %.

6. The thin film transistor according to claim 4, wherein the oxide semiconductor layer contains indium, gallium, and zinc.

7. A semiconductor device comprising a thin film transistor, the thin film transistor comprising:
a gate electrode;
a gate insulating film which covers the gate electrode;
an oxide semiconductor layer which overlaps with the gate electrode with the gate insulating film interposed therebetween;
a first electrode and a second electrode over the oxide semiconductor layer, an end portion of the first electrode and an end portion of the second electrode overlapping with the gate electrode;
a first buffer layer which is in contact with the oxide semiconductor layer and the first electrode and interposed between the oxide semiconductor layer and the first electrode; and a second buffer layer which is in contact with the oxide semiconductor layer and the second electrode and interposed between the oxide semiconductor layer and the second electrode, wherein the first buffer layer and the second buffer layer include indium, gallium, zinc, oxygen, and nitrogen.

8. The semiconductor device according to claim 7, wherein a proportion (N/O) of nitrogen (N) to oxygen (O) included in the buffer layers is greater than or equal to 5 at. % and less than or equal to 80 at. %.

9. The semiconductor device according to claim 7, wherein the oxide semiconductor layer contains indium, gallium, and zinc.

10. A semiconductor device comprising a thin film transistor, the thin film transistor comprising:

a gate electrode;

a gate insulating film which covers the gate electrode;

a first electrode and a second electrode, an end portion of the first electrode and an end portion of the second electrode overlapping with the gate electrode with the gate insulating film interposed therebetween;

a first buffer layer over the first electrode;

a second buffer layer over the second electrode; and an oxide semiconductor layer which overlaps with the end portion of the first electrode and the end portion of the second electrode, wherein the oxide semiconductor layer is in contact with side surfaces of the first electrode and the second electrode and top surfaces and side surfaces of the first buffer layer and the second buffer layer; and wherein the first buffer layer and the second buffer layer contain indium, gallium, zinc, oxygen, and nitrogen.

11. The semiconductor device according to claim 10, wherein a proportion (N/O) of nitrogen (N) to oxygen (O) included in the buffer layers is greater than or equal to 5 at. % and less than or equal to 80 at. %.

12. The semiconductor device according to claim 10, wherein the oxide semiconductor layer contains indium, gallium, and zinc.

* * * * *